(12) United States Patent
Cho et al.

(10) Patent No.: US 10,438,715 B2
(45) Date of Patent: Oct. 8, 2019

(54) NANOSTRUCTURE, METHOD OF PREPARING THE SAME, AND PANEL UNITS COMPRISING THE NANOSTRUCTURE

(71) Applicant: Samsung Electronics Co., Ltd., Suwon-si, Gyeonggi-do (KR)

(72) Inventors: Eunhyoung Cho, Hwaseong-si (KR); Inyong Song, Suwon-si (KR); Changseung Lee, Yongin-si (KR); Chan Kwak, Yongin-si (KR); Jaekwan Kim, Hwaseong-si (KR); Jooho Lee, Hwaseong-si (KR); Jinyoung Hwang, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 433 days.

(21) Appl. No.: 14/808,360

(22) Filed: Jul. 24, 2015

(65) Prior Publication Data

US 2016/0133349 A1    May 12, 2016

(30) Foreign Application Priority Data

Nov. 12, 2014  (KR) .......................... 10-2014-0157330
Jul. 22, 2015   (KR) .......................... 10-2015-0103875

(51) Int. Cl.
*H01B 1/22*      (2006.01)
*B82Y 10/00*     (2011.01)
(Continued)

(52) U.S. Cl.
CPC ................ *H01B 1/22* (2013.01); *B82Y 10/00* (2013.01); *B82Y 40/00* (2013.01); *C23F 1/02* (2013.01);
(Continued)

(58) Field of Classification Search
CPC ......... B82Y 40/00; B82Y 10/00; B82Y 30/00; H05K 1/09; H05K 2201/026;
(Continued)

(56) References Cited

U.S. PATENT DOCUMENTS 5,995,359 A    11/1999   Klee et al.
7,585,349 B2    9/2009   Xia et al.
(Continued)

FOREIGN PATENT DOCUMENTS

CN    101330099 A    12/2008
CN    103021532 A     4/2013
(Continued)

OTHER PUBLICATIONS

Hu, Liangbing et al., "Scalable Coating and Properties of Transparent, Flexible, Silver Nanowire Electrodes," American Chemical Society, vol. 4, No. 5, 2010, pp. 2955-2963.
(Continued)

*Primary Examiner* — Camie S Thompson
(74) *Attorney, Agent, or Firm* — Harness, Dickey & Pierce, P.L.C.

(57) ABSTRACT

Example embodiments relate to a nanostructure including a conductive region and a nonconductive region, wherein the conductive region includes at least one first nanowire, and the nonconductive region includes at least one second nanowire that is at least partially sectioned, a method of preparing the nanostructure, and a panel unit including the nanostructure.

42 Claims, 28 Drawing Sheets

(51) Int. Cl.
*B82Y 40/00* (2011.01)
*C23F 1/14* (2006.01)
*C23F 1/30* (2006.01)
*G06F 3/041* (2006.01)
*H01L 29/41* (2006.01)
*G06F 3/044* (2006.01)
*H01L 31/0224* (2006.01)
*C23F 1/02* (2006.01)
*C23F 1/40* (2006.01)
*H01L 29/06* (2006.01)
*H01L 33/42* (2010.01)

(52) U.S. Cl.
CPC .................. *C23F 1/14* (2013.01); *C23F 1/30* (2013.01); *C23F 1/40* (2013.01); *G06F 3/041* (2013.01); *G06F 3/044* (2013.01); *G06F 3/0412* (2013.01); *H01L 29/413* (2013.01); *H01L 31/022466* (2013.01); *G06F 2203/04103* (2013.01); *G06F 2203/04112* (2013.01); *H01L 29/0673* (2013.01); *H01L 33/42* (2013.01)

(58) Field of Classification Search
CPC ... H05K 2203/0325; H05K 2203/1142; H05K 3/02; H05K 3/06; H05K 3/027; H05K 2201/125; H05K 9/009; Y10T 428/24802; Y10T 428/24917; Y10T 428/24942; Y10T 442/24802; C23F 1/32; C23F 1/02; C23F 1/30; C23F 1/40; C23F 1/14; H01B 1/22; H01B 3/105; H01B 1/02; H01L 29/413; H01M 4/38; C23C 22/58; C23C 22/73; C23C 22/78; C23C 18/08; B82B 1/008; B82B 3/008; B22F 9/16; B22F 9/21; B22F 1/0025
USPC ............... 977/762; 442/377; 428/196, 195.1; 252/512; 427/97.4, 556, 98.4
See application file for complete search history.

(56) References Cited

U.S. PATENT DOCUMENTS

| | | | |
|---|---|---|---|
| 8,018,568 | B2 | 9/2011 | Allemand et al. |
| 8,174,667 | B2 | 5/2012 | Allemand et al. |
| 8,728,358 | B2 | 5/2014 | Ikisawa et al. |
| 2008/0143906 | A1* | 6/2008 | Allemand ............ B82Y 10/00 349/43 |
| 2008/0224115 | A1 | 9/2008 | Bakkers et al. |
| 2010/0200286 | A1 | 8/2010 | Melcher et al. |
| 2012/0153236 | A1 | 6/2012 | Cakmak et al. |
| 2012/0300168 | A1 | 11/2012 | Hoke |
| 2013/0078436 | A1 | 3/2013 | Naito et al. |
| 2014/0063360 | A1 | 3/2014 | Kunishi et al. |
| 2014/0284083 | A1 | 9/2014 | Srinivas et al. |
| 2015/0010695 | A1* | 1/2015 | Poon .................. H05K 1/0296 427/97.4 |

FOREIGN PATENT DOCUMENTS

| | | |
|---|---|---|
| CN | 103069369 A | 4/2013 |
| CN | 104040642 A | 9/2014 |
| KR | 20120092294 A | 8/2012 |
| KR | 20130107460 A | 10/2013 |
| KR | 20140002360 A | 1/2014 |
| KR | 20140007221 A | 1/2014 |
| WO | WO-2010119687 A1 | 10/2010 |
| WO | WO-2012/083082 A1 | 6/2012 |
| WO | WO-2013/029028 A2 | 2/2013 |
| WO | WO-2013/173070 A1 | 11/2013 |
| WO | WO-2014058562 A3 | 4/2014 |
| WO | WO-2014/161380 A1 | 10/2014 |
| WO | WO-2014/161499 A1 | 10/2014 |

OTHER PUBLICATIONS

Kumar, Kiran A.B.V. et al., "Silver nanowire based flexible electrodes with improved properties: High conductivity, transparency, adhesion and low haze," Materials Research Bulletin, vol. 48, 2013, pp. 2944-2949.

Preston, Colin et al., "Silver nanowire transparent conducting paper-based electrode with high optical haze," Journal of Materials Chemistry C, vol. 2, 2014, pp. 1248-1254.

Preston, Colin et al., "Optical haze of transparent and conductive silver nanowire films," Nano Research, vol. 6(7), 2013, pp. 461-468.

Kwon, Jihoon et al., "A study on detecting amine gas using chemical characterization of Ag nanowire," Proceedings of 10th IEEE International Conference on Nanotechnology Joint Symposium with Nano Korea, 2010, pp. 753-757.

Nirmalraj, Peter N. et al., "Manipulating Connectivity and Electrical Conductivity in Metallic Nanowire Networks," Nano Letters, vol. 12, 2012, pp. 5966-5971.

Wienk, I.M. et al., "Chemical Treatment of Membranes of a Polymer Blend: Mechanism of the Reaction of Hypochlorite with Poly(vinyl pyrrolidone)," Journal of Polymer Science: Part A: Polymer Chemistry, vol. 33, 1995, pp. 49-54.

Spaid, Michael, "Wet-Processable Transparent Conductive Materials," Information Display, Society for Information Display, vol. 28, No. 1, Jan. 2012, pp. 10-15.

European Search Report dated Apr. 1, 2016, to corresponding European Patent Application No. EP 15 18 6423.

Teppei Araki, "Low haze transparent electrodes and highly conducting air dried films with ultra-long silver nanowires synthesized by one-step polyol method", Nov. 13, 2013, pp. 1-32, Tsinghua University Press.

Chinese Office Action dated Sep. 5, 2017, for corresponding Chinese Patent Application No. 201510770231.5.

"Microfiltration membrane development and module design", H. D. W. Roesink, Ph. D Thesis Twente University, Enshede, 1989.

Chinese Office Action dated Dec. 4, 2018 issued in corresponding Chinese Application No. 201510770231.5 (with English translation).

* cited by examiner (I)

(II)

NANOSTRUCTURE, METHOD OF PREPARING THE SAME, AND PANEL UNITS COMPRISING THE NANOSTRUCTURE

RELATED APPLICATION

This application claims the benefit of priority from Korean Patent Application Nos. 10-2014-0157330, filed on Nov. 12, 2014, and 10-2015-0103875, filed on Jul. 22, 2015, in the Korean Intellectual Property Office, the disclosure of which is incorporated herein in its entirety by reference.

BACKGROUND

1. Field

Example embodiments relate to nanostructures, methods of preparing the same, and/or panel units including the nanostructures.

2. Description of the Related Art

Indium tin oxide (ITO) has been widely used to form a transparent electrode of various electronic products such as, for example, liquid crystal displays (LCDs), organic light emitting displays (OLEDs), and touchscreens.

However, since ITO is typically fragile, it may be difficult to use ITO in flexible displays and solar cells, and its manufacturing costs are increasing as well. Thus, it may be advantageous to develop a material replacing ITO.

SUMMARY

Example embodiments relate to nanostructures and/or methods of preparing the same.

Example embodiments relate to panel units in which visibility impairment does not occur after patterning by including the nanostructures.

Additional example embodiments will be set forth in part in the description which follows and, in part, will be apparent from the description, or may be learned by practice of the example embodiments.

According to at least one example embodiment, a nanostructure includes a conductive region and a nonconductive region, wherein the conductive region includes at least one first nanowire, and the nonconductive region includes at least one second nanowire partially disconnected or sectioned.

An average diameter of the second nanowire may be less than an average diameter of the first nanowire, and a difference of the average diameter between the first nanowire and the second nanowire may be 5% or less of the average diameter of the first nanowire According to at least one example embodiment, a method of preparing the nanostructure includes forming a first nanowire layer including at least one first nanowire, preparing a conductive film including the first nanowire and a matrix by coating a matrix-forming material on the first nanowire layer, and etching one region of the conductive film by bringing an etching solution including at least one of alkali metal hypochlorite and alkali earth metal hypochlorite into contact with the one region under weak acidic conditions or under alkaline conditions.

According to at least one example embodiment, a panel unit comprising the nanostructure.

The panel unit may be a flat panel display (FPD), a touchscreen panel (TSP), a flexible display, or a foldable display

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
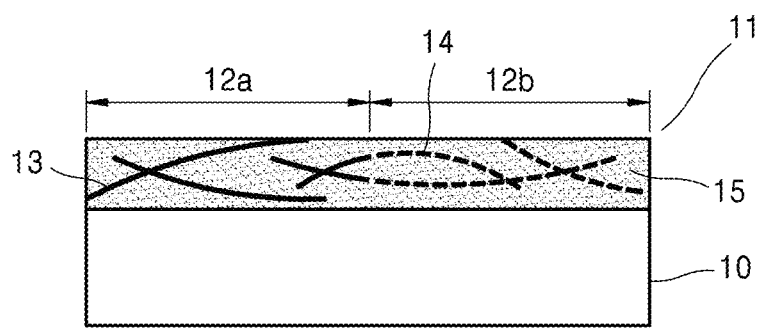
FIG. 1 is a schematic diagram illustrating a structure of a conductive film including a nanostructure according to at least one example embodiment.

Reference will now be made in detail to example embodiments illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A nanostructure according to at least one example embodiment includes a conductive region and a nonconductive region. The conductive region includes at least one first nanowire, and the nonconductive region includes at least one second nanowire partially disconnected or sectioned.

Since a sheet resistance of the nonconductive region is $10^9 \Omega/\square$ or greater, e.g., from $10^{10} \Omega/\square$ to infinity, the nonconductive region does not have conductivity. Thus, since the nonconductive region maintains non-conductivity even over the lapse of time, an insulating portion has improved reliability.

In order to reduce or substantially prevent visibility impairment occurring after patterning nanowires in the nanostructure, an average diameter of the second nanowire may be controlled such that the average diameter of the second nanowire is smaller than the average diameter of the first nanowire, and the difference of the average diameter between the first nanowire and the second nanowire is equal to or less than substantially 5% of the average diameter of the first nanowire.

A transparent conductive film including silver nanowires (AgNWs) may be used to replace an indium tin oxide (ITO) electrode. In general, a mixture of phosphoric acid and nitric acid or a mixture of phosphoric acid, nitric acid, and acetic acid is used as an etching solution to form the transparent conductive film including silver nanowires. When a transparent conductive film including silver nanowires is formed using these etching solutions, visibility impairment may occur due to differences of transmittance and haze between patterns after etching. Alternatively, even when visibility impairment occurring after patterning is reduced or substantially prevented by partial etching, additional etching may further proceed over time to worsen the visibility impairment. On the contrary, since a conductive route may be re-constructed over time by external electric power in a region where nanowires are etched, reliability of wiring may be reduced.

In the nanostructure according to at least one example embodiment, an insulating film may be formed on the surface of the second nanowire disposed in the nonconductive region. When the insulating film is formed, visibility impairment conventionally occurring as etching further proceeds over time and re-construction of the conductive route caused by external electric power may be reduced or substantially prevented, thereby improving wiring reliability of the insulating portion. Thus, insulating properties of the nonconductive region (insulating portion) may be maintained over time.

Thus, considering that total light scattering of the nanostructure depends more on a diameter variation of the nanowires than on a length variation of the nanowires (FIG. 4C), a partial etching of the second nanowire was induced such that the average diameter of the second nanowire disposed in the nonconductive region is smaller than the average diameter of the first nanowire disposed in the conductive region. And the difference of the average diameter between the first nanowire and the second nanowire is equal to or less than substantially 5%. As described above, an etching process of the second nanowire disposed in the nonconductive region may be controlled to adjust the shape of the second nanowire. Thus, in the nanostructure according to at least one example embodiment, visibility impairment occurring after patterning, caused by differences of transmittance, refractive index, and haze, may be reduced or substantially prevented using the shape of nanowires and relationships of optical properties such as transmittance, haze, and refractive index. When the nanostructure according to at least one example embodiment is used, an additional light diffusion layer may not be required.

Figure 4A:
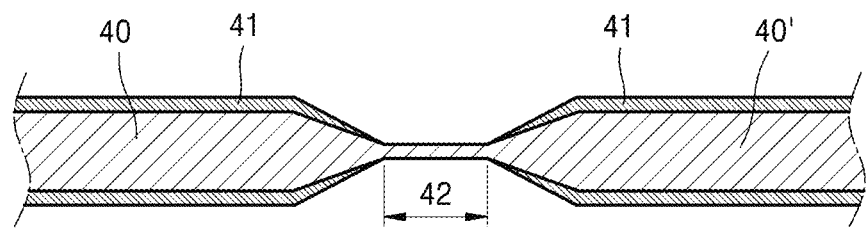
FIG. 4A is a schematic diagram illustrating a structure of a second nanowire in a nanostructure according to at least one example embodiment.
Figure 4B:
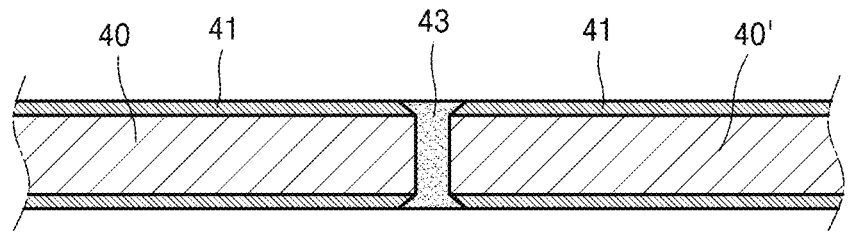
FIG. 4B is a schematic diagram illustrating a structure of a second nanowire according to at least one example embodiment.
Figure 4C:
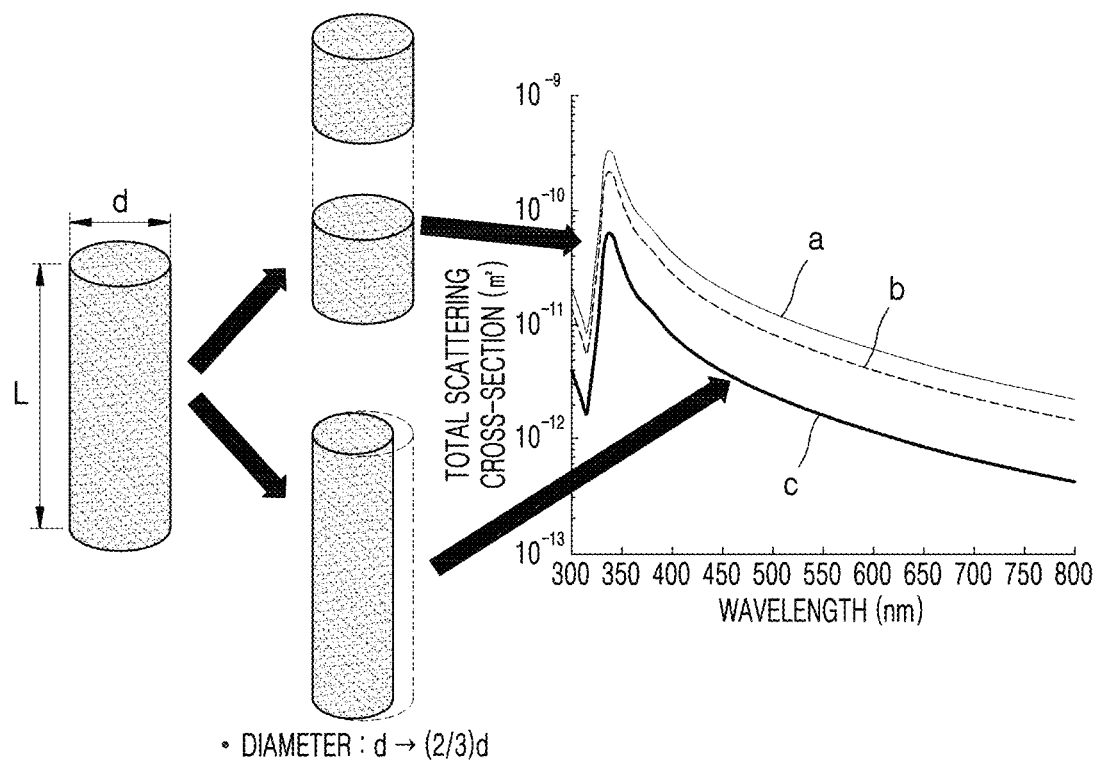
FIG. 4C is a diagram illustrating variations of total scattering cross-section in a silver nanowire according to changes in shapes thereof by etching.

Referring to FIG. 4C, a total scattering cross-section is reduced when the average diameter of the nanowire is reduced (c), as compared with when the average length of the nanowire is reduced (b). In FIG. 4C, (a) indicates an original state before reducing the average length and the average diameter.

The average diameter of the second nanowire may be less than the average diameter of the first nanowire. A difference of the average diameter between the first nanowire and the second nanowire may be equal to or less than substantially 5% of the average diameter, for example, in a range of about 0.01 to about 5% or about 0.02 to about 3%, of the first nanowire. Since the difference of the average diameter between the second nanowire and the first nanowire is small as described above, an increase in transmittance and a decrease in haze are negligible in the nonconductive region, thereby reducing or substantially preventing visibility impairment between regions in the nanostructure.

The average diameter of the first nanowire may be in a range of about 10 nm to about 100 nm, for example, about 15 nm to about 50 nm, and the average diameter of the second nanowire may be in a range of about 9.5 nm to about 95 nm, for example, about 14 nm to about 47.5 nm.

The difference of the average diameter between the first nanowire and the second nanowire may be in a range of about 0.5 nm to about 5 nm.

A difference of the average length between the second nanowire disposed in the nonconductive region and the average length of the first nanowire may be small. The difference of the average length between the first nanowire and the second nanowire may be equal to or less than 20%, for example, 10% or less, particularly, in a range of about 0.01 to about 10%, of the average length of the first nanowire.

The average length of the first nanowire may be in a range of about 3 to about 200 μm, for example, about 50 to about 100 μm, and the average length of the second nanowire may be in a range of about 2.4 to about 80 μm, for example, about 10 to about 50 μm or about 8 to about 40 μm.

The difference of the average length between the first nanowire and the second nanowire may be in a range of about 0.6 to about 20 μm.

A difference of sheet resistance between the conductive region and the nonconductive region may be $10^9 \Omega/\square$ or greater.

In the nonconductive region, a deviation of the average diameter of the at least one second nanowire is in a range of about 5 to about 10 nm, and a deviation of the average length thereof is in a range of about 2 to about 10 μm. On the other hand, in the conductive region, a deviation of the average diameter of the at least one first nanowire is in a range of about 1 to about 5 nm, and a deviation of the average length thereof is in a range of about 2 to about 5 μm. As described above, the first nanowire has a more uniform diameter and length than the second nanowire.

The second nanowire may have an aspect ratio of about 1 to about 500, and the first nanowire may have an aspect ratio of about 20 to about 10000. In addition, the second nanowire has an aspect uniformity of 90% or greater, for example, in a range of about 90% to about 95%. In this regard, the aspect uniformity is obtained by calculating a deviation among about 10 aspect ratios of the second nanowire. On the contrary, the first nanowire may have an aspect uniformity that is less than 90%, which is less than the aspect uniformity of the second nanowire.

When the nanostructure including the first nanowire and the second nanowire respectively having the aforementioned average diameters, average lengths, and aspect ratios is used, visibility impairment occurring after patterning caused by differences of haze and transmittance may be reduced or substantially prevented.

The first nanowire and second nanowire may include at least one of a metal, a metal alloy, a metal sulfide, a metal chalcogenide, a metal halide, or a semiconductor, respectively. For example, the first nanowire and second nanowire may include at least one of iron (Fe), platinum (Pt), nickel (Ni), cobalt (Co), aluminum (Al), silver (Ag), gold (Au), copper (Cu), silicon (Si), germanium (Ge), cadmium sulfide (CdS), cadmium selenide (CdSe), cadmium telluride (CdTe), zinc sulfide (ZnS), zinc selenide (ZnSe), zinc tellurid (ZnTe), gallium nitride (GaN), gallium phosphide (GaP), gallium arsenide (GaAs), gallium antimonide (GaSb), aluminum nitride (AlN), aluminum phosphide (AlP), aluminum arsenide (AlAs), aluminum antimonide (AlSb), indium phosphide (InP), indium arsenide (InAs), indium antimonide (InSb), silicon carbide (SiC), iron-platinum (FePt), ferric oxide ($Fe_2O_3$), and ferrous oxide ($Fe_3O_4$), respectively.

According to at least one example embodiment, the first nanowire and second nanowire may include silver (Ag).

According to at least one example embodiment, the nonconductive region of the nanostructure may further include a second nanowire having an area with a substantially smaller average diameter than the other areas as illustrated in FIG. 4A. The area with a substantially smaller average diameter than the other areas may be referred to as an "electrically non-connected bridge." An average diameter of the electrically non-connected bridge may be controlled to be less than an average diameter of the other areas.

The electrically non-connected bridge of the second nanowire has a resistance of, for example, $10^9 \Omega/\square$ or greater, thereby substantially having non-conductivity.

A nanostructure according to at least one example embodiment may include a second nanowire having an average diameter different from the average diameter of the first nanowire of the conductive region by 5% or less of the average diameter of the first nanowire (hereinafter, referred to as "second nanowire Aco and a second nanowire having the aforementioned electrically non-connected bridge (hereinafter, referred to as "second nanowire Bco.

A nanostructure according to at least one example embodiment may have a nonconductive region in which an insulating film is formed between a plurality of nanowires as illustrated in FIG. 4B.

A nanostructure according to at least one example embodiment may include the second nanowire A and a second nanowire having a structure in which an insulating film is formed between a plurality of nanowires (hereinafter, referred to as a "second nanowire Cco.

A nanostructure according to at least one example embodiment may include the second nanowire A, the second nanowire B, and the second nanowire C.

A mixing ratio of the second nanowire A, the second nanowire B, and the second nanowire C may vary. Amounts of the second nanowire B and the second nanowire C may be in a range of 0.1 to about 50 parts by weight, respectively, based on 100 parts by weight of the second nanowire A.

The first nanowire constitutes a conductive network structure. In this regard, the conductive network may have a sheet resistance or $10^6 \Omega/\square$ or less, for example, $10^5 \Omega/cm$ or less, for example, in a range of about 10 to about 1000 $\Omega/cm$.

A polymer film may be formed on at least one portion of the surface of the first nanowire. The polymer film may include at least one polymer such as of polyvinyl pyrrolidone, polystyrene, polyethyleneimine, polyphosphazene, polylactide, polylactide-co-glycolide, polycaprolactone, polyanhydride, polymaleic acid and derivatives thereof, polyalkylcyanoacrylate, polyhydroxybutylate, polycarbonate, polyorthoester, polyethylene glycol, poly-L-lycine, polyglycolide, and polymethylmethacrylate.

In general, nanowires are wires with small diameters and tend to aggregate due to high surface tension of the nanowires. Thus, dispersibility of nanowires may be improved and the nanowires may be protected by forming the polymer film on the surfaces of the nanowires.

In the same manner as the first nanowire, a polymer film may be formed on at least one portion of the surface of the second nanowire.

An insulating film may be formed on at least one portion of the surface of the second nanowire. The insulating film may reduce or substantially prevent re-construction of a conductive route conventionally caused by external electric power even with the lapse of time.

The insulating film may include at least one of silver chloride (AgCl) and silver oxide. In this case, a thickness of the insulating film is not particularly limited and may be, for example, in a range of about 0.0001 nm to about 10 nm.

A transmittance of the nonconductive region is greater than the transmittance of the conductive region, and a difference of the transmittance between the nonconductive region and the conductive region may be equal to or less than 0.1%, for example, in a range of about 0.01% to about 0.1%, of the transmittance of the nonconductive region.

A haze of the nonconductive region is less than the haze of the conductive region, and a difference of the haze between the nonconductive region and the conductive region may be equal to or less than 0.2%, for example, in a range of about 0.01% to about 0.15%, of the haze of the nonconductive region.

A sheet resistance of the nonconductive region is greater than the sheet resistance of the conductive region, and a difference of the sheet resistance between the nonconductive region and the conductive region may be $10^9 \Omega/\square$ or greater, for example, $10^{10} \Omega/\square$ or greater.

The nonconductive region may have a transmittance greater than 90%, a haze of 1% or less, and a sheet resistance of $10^9 \Omega/\square$ or greater. The transmittance may be, for example, in a range of about 90.2 to about 95%, and the haze may be, for example, in a range of about 0.7 to about 0.9%.

Used herein, the term transmittance refers to the percentage of incident light that penetrates a medium. The nanostructure has a transmittance of about 80% to about 98%.

The haze, as an index of light scattering, refers to the percentage of transmitted light which in passing through a specimen deviates from the incident beam and is scattered. The nanostructure has a haze of about 10% or less, for example, 5% or less. According to at least one example embodiment, the nanostructure may have a haze of 2% or less, for example, 1% or less, particularly, 0.25% or less.

In the nanostructure, the conductive and nonconductive regions further include a matrix. The matrix is a solid material in which nanowires are dispersed or buried for protection of the nanowires to reduce or substantially prevent the nanowires from being worn or corroded. In the conductive and nonconductive region, the nanowires may be partially exposed or protrude from a polymer matrix to be accessed to a conductive network.

The matrix may include at least one polymer such as a polyurethane-based resin, a polyester-based resin, a polyacrylic resin, a polymethacrylic resin, a polyether-based resin, a cellulose-based resin, polyvinyl alcohol, an epoxy-based resin, polyvinyl pyrrolidone, a polystyrene-based resin, polyethylene glycol, polyaniline, polythiophene, and polydiacetylene. The matrix may have a thickness of about 10 nm to about 5 μm, for example, about 50 to about 200 nm.

The matrix may further include an inorganic material. Examples of the inorganic material include silica ($SiO_2$), alumina ($Al_2O_3$), silicon carbide (SiC), and an alumina-silica ($Al_2O_3$—$SiO_2$) complex. When the inorganic material is further added to the matrix, diffusion of light may be controlled, and thus a nanostructure having have reduced glare may be prepared.

The nanostructure according to at least one example embodiment may further include an overcoat layer. The overcoat layer may be formed to stabilize and protect the conductive network of the nanostructure and improve optical properties such as anti-glare effects and anti-reflection effects.

The overcoat layer may be, for example, an anti-reflection layer, a protective layer, a barrier layer, or a hard coat layer. For example, the anti-reflection layer may include a light scattering material such as colloidal silica and fumed silica and an anti-glare material such as siloxane, polythiophene, polypyrrole, and polyurethane. The protective layer may include polyester, polyethylene terephthalate, polyvinyl alcohol, polyvinyl chloride, polyvinylidene chloride, and polyethylene.

According to at least one example embodiment, a conductive film including a base material and a nanostructure formed on the base material is provided. The conductive film may be used as an optical film.

FIG. 1 is a schematic diagram illustrating a structure of a conductive film including a nanostructure according to at least one example embodiment.

Referring to FIG. 1, the conductive film has a structure in which a nanostructure 11 is formed on a base material 10. The nanostructure 11 includes a conductive region 12a and a nonconductive region 12b. The nanostructure 11 may further include a matrix 15.

According to at least one example embodiment, the conductive region 12a includes at least one first nanowire 13, and the nonconductive region 12b includes at least one second nanowire 14 partially disconnected or sectioned. The nonconductive region 12b maintains insulating property thereof even over time. In addition, since differences of haze, transmittance, and refractive index between the conductive region 12a and the nonconductive region 12b are small, visibility impairment thereby may be reduced or substantially prevented.

A method of preparing a conductive film including the nanostructure according to at least one example embodiment will be described with reference to FIGS. 2A to 2D.

Figure 2A:
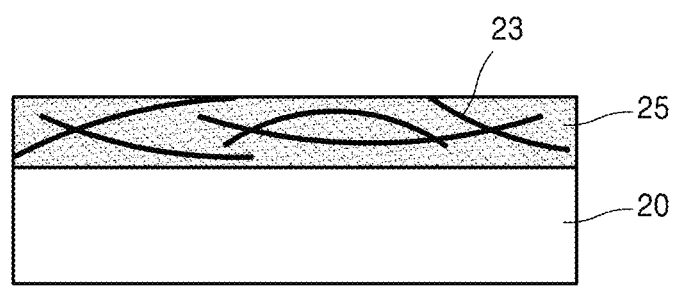
FIGS. 2A to 2D are diagrams for describing a method of preparing a conductive film including a nanostructure according to at least one example embodiment.

First, a conductive film including a first nanowire 23 and a matrix 25 is formed on a base material 20 (FIG. 2A). Here, a thickness of the conductive film may be in a range of about 0.1 to about 10 µm, for example, about 1 to about 150 nm, or for example, about 100 nm.

The base material 20 may be any material that is transparent, does not inhibit light transmission, and has elasticity and durability corresponding to desired use thereof, without limitation.

For example, the base material 20 may include at least one of polyethyleneterephthalate (PET), polycarbonate (PC), polymethylmethacrylate (PMMA), polyethylenenaphthalate (PEN), polyethersulfone (PES), cyclic olefin copolymer (COC), triacetylcellulose (TAC), polyvinyl alcohol (PVA), polyimide (PI), and polystyrene (PS).

A thickness of the base material 20 may be in a range of about 10 to about 200 µm and may be adjusted within a range capable of forming a film for use of a device.

The conductive film including the first nanowire 23 and the matrix 25 is prepared by forming the first nanowire on the base material 20, coating a matrix-forming composition thereon, and drying the composition. A first nanowire layer includes a plurality of nanowires and is formed on the base material to a desired, or alternatively predetermined thickness.

The first nanowire may be silver nanowire.

The silver nanowire may be synthesized by a method of using a mold such as carbon nanotube and polycarbonate membrane, a method of using nanocrystal silver bromide (AgBr) and silver nitrate ($AgNO_3$), a method of performing arc discharge of two silver electrodes in a sodium nitrate ($NaNO_3$) aqueous solution, and a reduction method by using a polymer such as polyvinyl alcohol (PVA) and polyvinyl pyrrolidone (PVP). However, synthesis methods of the silver nanowire are not limited to those described above and may include various other methods. The silver nanowire may form a silver nanowire layer with a desired, or alternatively predetermined solvent.

The matrix 25 may be formed of or include a polymer having a transmittance of 85% or greater in a visible light region. Examples of the polymer may include a polyurethane-based resin, a polyester-based resin, an acrylic resin, a polyether-based resin, a cellulose-based resin, a polyvinyl alcohol-based resin, an epoxy-based resin, polyvinyl pyrrolidone, a polystyrene-based resin, polyethylene glycol, pentaerythritol, and polypyrrole, which are used alone or in a combination of at least two thereof.

The matrix-forming composition includes a matrix-forming polymer, a dispersion stabilizer, and a solvent. The solvent may include at least one of deionized water, alcohol, ketone, ether, hydrocarbon, and an aromatic compound. In this regard, examples of the alcohol include ethanol and isopropanol.

The matrix-forming composition may be coated by spin coating, slit coating, bead coating, spray coating, printing, dip coating, or the like.

Instead of the matrix-forming polymer, a prepolymer or monomer available in preparation of the matrix-forming polymer may be added thereto. When the prepolymer or monomer is used, a process of applying light or heat is performed after the matrix-forming composition including the prepolymer or monomer is coated on the first nanowire layer. By this process of applying light or heat, the prepolymer or monomer forms the corresponding matrix-forming polymer.

Any prepolymer or monomer commonly used in the art may be used. Examples of the prepolymer or monomer include alkyl or hydroxyalkyl acrylates or methacrylates such as methyl acrylate, ethyl acrylate, butyl acrylate, 2-ethylhexyl acrylate and 2-hydroxyethyl acrylate, isobonyl acrylate, methyl methacrylate, and ethyl methacrylate, vinyl esters such as silicone acrylate, acrylonitrile, acrylamide, methacrylamide, N-substituted (meth)acrylamide, and vinyl acetate, vinyl ethers such as isobutyl vinyl ether, styrene, N-vinylpyrrolidone, vinyl chloride, vinylidene chloride, diacrylates of ethylene glycol, propylene glycol, neopentyl glycol, hexamethylene glycol, and bisphenol A, 4,4'-bis(2-acryloyloxyethoxy) diphenylpropane, vinylacrylate, divinyl benzene, divinyl succinate, dianyl phthalate, triallyl phosphate, triallyl isocyanurate, tris (2-acryloylethyl) isocyanurate, epoxy resin, acrylicized epoxy resins, acrylicized polyesters, vinyl ethers having epoxy group, polyurethane and polyether, and unsaturated polyester resins including an epoxy group, without being limited thereto.

When the process of applying light or heat is performed, a polymerization initiator is added to the matrix-forming composition.

A photo-polymerization initiator or thermal polymerization initiator may be used. The photo-polymerization initiator may be any compound that produces radicals by light such as UV light. For example, the photo-polymerization initiator may include at least one of 2-hydroxy-2-methyl-1-phenyl-propane-1-one (HMPP), benzoin ether, dialkyl acetophenone, hydroxyl alkylketone, phenyl glyoxylate, benzyl dimethyl ketal, acyl phosphine, and ndl, acyl pho.

The thermal polymerization initiator may include at least one of a persulfate-based initiator, an azo-based initiator, hydrogen peroxide, and ascorbic acid. Particularly, examples of the persulfate-based initiator include sodium persulfate ($Na_2S_2O_8$), potassium persulfate ($K_2S_2O_8$), and ammonium persulfate (($NH_4$)$_2S_2O_8$). Examples of the azo-based initiator include 2,2-azobis-(2-amidinopropane)dihydrochloride, 2,2-azobis-(N,N-dimethylene)isobutyramidine di hydrochloride, 2-(carbamoylazo)isobutylonitril, 2,2-azobis[2-(2-imidazolin-2-yl)propane]dihydrochloride, and 4,4-azobis-(4-cyanovaleric acid). The polymerization initiator may be used in an amount commonly used in the art.

The dispersion stabilizer is a material capable of stably dispersing ingredients of the matrix-forming composition. Examples of the dispersion stabilizer include N,N-formamide, N,N-diacetamide, cellulose derivatives such as methyl cellulose, ethyl cellulose, and hydroxypropyl cellulose, polyvinyl alcohol, poly(vinyl methyl ether), poly(acrylic acid), polyvinyl acetate, polyvinyl pyrrolidone, and a copolymer of vinyl pyrrolidone and vinyl acetate. The dispersion stabilizer may be used in an amount commonly used in the art.

Figure 2B:
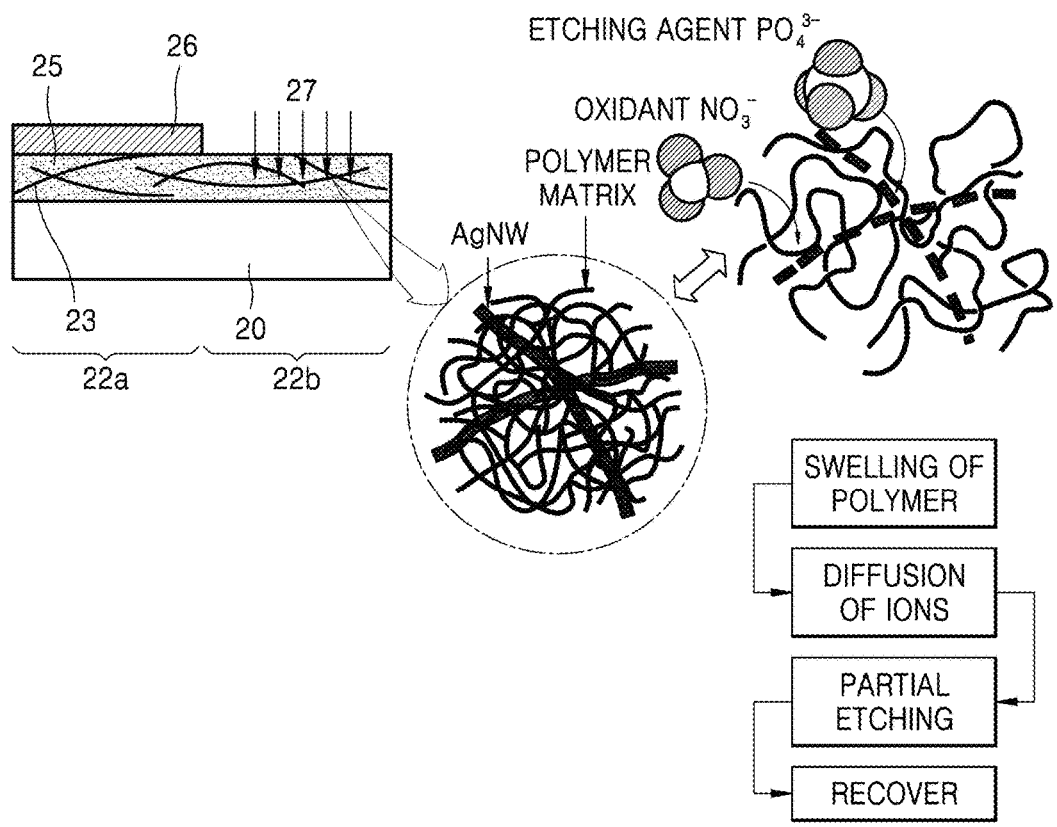

As illustrated in FIG. 2B, a mask pattern 26 is formed on a portion (first region) of the conductive film, and a second region of the conductive film on which the mask pattern 26 is not formed is brought into contact with an etching solution (FIG. 2B). In this regard, the second region corresponds to a nonconductive region 22b.

The mask pattern 26 may be formed by a conventional photolithography process. A photoresist film is formed on the conductive film and patterned to form the mask pattern 26 only in the first region of the conductive region. In this regard, the first region corresponds to a conductive region 22a.

In order to apply the etching solution to only the second area of the conductive film as described above, the mask pattern 26 may be used as illustrated in FIG. 2B. However, various other methods may also be used without using the mask pattern 26. The etching solution may be applied to only the second region of the conductive film by spray coating, printing, doctor blade coating, or the like.

The second nanowire 14 is partially etched while the etching solution contacts only with the second region 22b of the conductive film. A partial etching mechanism is as follows.

First, an etching agent passes through the matrix to oxidize the surface of the silver nanowires. Then, silver ions bind to anions of the etching agent. By appropriately adjusting etching time, the surface of the silver nanowires may be partially etched.

As illustrated in FIG. 2B, when the etching solution is brought into contact with the second region of the conductive film, the matrix-forming polymer (polymer matrix) swells to expand free space. As ions of the etching solution are diffused and migrate through the expanded free space, the surface of the second nanowire is oxidized in the non-masked area and partially etched via reactions between silver ions and the etching solution. Examples of the ions of the etching solution include $PO_4^{3-}$ of the etching agent and $NO_3^-$ of an oxidant.

Figure 2C:
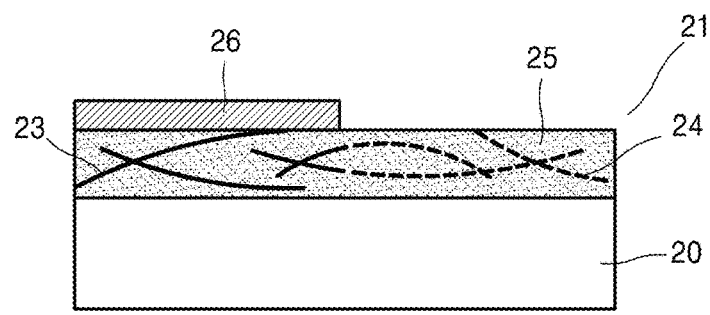
Figure 2D:
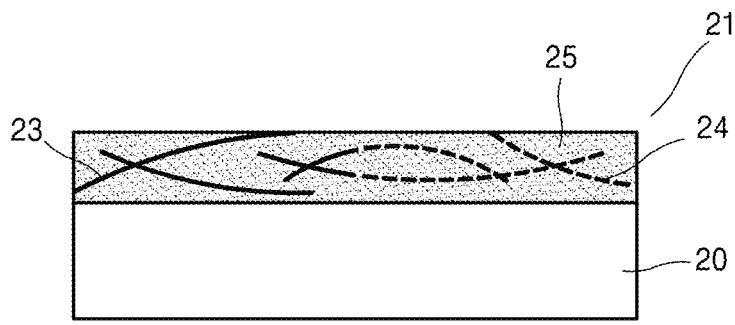

As illustrated in FIG. 2C, the silver nanowires are not removed but partially etched to be suitable for electrical insulation by adjusting the etching time. Thus, in the non-masked area (nonconductive region 22b) on the base material 20, a conductive film including at least one second nanowire 24 partially disconnected in the matrix 25 is formed. By removing the mask 26, a structure in which the nanostructure 21 is formed on the base material 20 is prepared as illustrated in FIG. 2D. The nanostructure 21 has a structure including the conductive region including at least one first nanowire 23, the nonconductive region including at least one second nanowire 24 partially disconnected or sectioned, and the matrix 25.

The etching solution may be brought into contact with the second region of the conductive film by dipping the second region of the conductive film in the etching solution or spray-coating the etching solution onto the second region of the conductive film. The nanostructure may be mass-produced by spray coating.

The etching time may vary according to types of the etching solution and methods of contacting the conductive film with the etching solution. The etching time may be in a range of about 10 seconds to about 10 minutes, for example, about 30 seconds to 120 seconds. When the etching time is within the ranges described above, the etching solution does not etch the nanowires of the first region corresponding to the conductive region, visibility impairment caused by differences of haze and transmittance of the conductive film does not typically occur in the conductive film having the nanostructure, and the nanostructure may be mass-produced.

The etching solution includes at least one metal hypochlorite such as alkali metal hypochlorite and alkali earth metal hypochlorite. An amount of the metal hypochlorite may be in a range of about 1 to about 30% by weight based on a weight of the etching solution.

The amount of the metal hypochlorite contained in the etching solution may slightly vary according to a subject to be etched (structure of the nanostructure). For example, when the nanostructure includes the conductive region including the first nanowire and the nonconductive region including the second nanowire, and further includes the matrix, the amount of the metal hypochlorite contained in the etching solution may be adjusted according to the degree of hardness of the matrix. For example, the amount of the metal hypochlorite may be in a range of about 1 to about 30% by weight, for example, about 5 to about 20% by weight in the etching solution. When the nanostructure does not include the matrix, the amount of the metal hypochlorite may be in a range of about 1 to about 5% by weight, for example, about 2 to about 5% by weight in the etching solution. As described above, when the nanostructure does not include the matrix, a smaller amount of metal hypochlorite may be contained in the etching solution as compared with the nanostructure including the matrix.

The metal hypochlorite may be used in a state of being dissolved in a solvent such as deionized water. A concentration of the metal hypochlorite may be in a range of about 5 to about 20% by weight. By using the metal hypochlorite having the concentration describe above, the nanostructure having desired optical characteristics may be obtained by adjusting etching rate and etching time.

The etching solution may include an oxidant and a solvent in addition to the metal hypochlorite. The etching solution may further include an etching agent commonly used in the art.

The oxidant may be any oxidant commonly used in the art. The oxidant may include at least one of a peroxide, a persulfide, a peroxo compound, a metal oxide salt, an organic oxidant, and a gas oxidant.

Examples of the peroxide include nitric acid, hydrogen peroxide, and potassium permanganate ($KMnO_4$), examples of the persulfide include ammonium persulfate, and examples of the peroxo compound include sodium persulfate and potassium persulfate. Examples of the metal oxide salt include an oxidized salt including palladium, magnesium, cobalt, copper, or silver.

The gas oxidant may be air, oxygen, or ozone. The organic oxidant may be iron chloride, copper chloride, or 7,7',8,8'-tetracyacnoquinodimethane.

When silver nanowires are used, the oxidant is involved in a reaction with the silver nanowires to convert silver into silver oxide.

The oxidant may be used in an amount commonly used in the art. For example, the amount of the oxidant may be in a range of about 0.1 to about 10% by weight based on the total weight of the etching solution. When the amount of the oxidant is within the range described above, visibility impairment occurring after patterning caused by differences of haze and light transmittance may be reduced or substantially prevented.

The etching agent may be any material commonly used in the art. The etching agent may include at least one of phosphoric acid, acetic acid, sodium nitrate ($NaNO_3$), ammonium persulfate (($NH_4$)$_2S_2O_8$), and a halide.

Examples of the halide include an iodide ($I_2$), a chloride, and a bromide. In this regard, the etching agent may be used in an amount commonly used in the art, for example, in a range of about 1 to about 100 parts by weight based on 100 parts by weight of the metal hypochlorite.

The solvent may be water, alcohol, or the like. The solvent may be used in an amount commonly used in the art. The amount of the solvent may be in a range of about 5 to about 30% by weight based on the total weight of the etching solution.

The pH of the etching solution may be adjusted such that the polymer of the polymer film disposed on the surface of the nanowires is easily removed during etching and the difference of the average diameter between the nanowires of the etched region and the non-etched region is maintained within 5%. The pH of the etching solution is adjusted to weak acidic conditions or alkaline conditions.

Under weak acidic conditions, the pH of the etching solution is in a range of about 3 to about 6, for example, about 3 to about 4. Under the alkaline conditions, the pH of the etching solution is 10 or greater, for example, 11.5 or greater, particularly, in a range of about 12 to about 13. When the pH is within the ranges described above, visibility impairment does not typically occur in the nanostructure and the insulating portion of the nanostructure may have excellent reliability. When the pH of the etching solution is greater than the ranges described above, over-etching of the nanowires may increase differences of haze, transmittance, and refractive index between the regions, thereby causing visibility impairment between patterns. On the other hand, when the pH of the etching solution is less than the ranges described above, the polymer film such as polyvinyl pyrrolidone remains on the surface of the nanowires, so that the differences of haze, transmittance, and refractive index between regions may not be efficiently reduced due to a low etching rate of the nanowires.

The etching solution may further include a reaction retardant and a pH adjusting agent.

The reaction retardant adjusts the etching rate or reactivity, and examples of the reaction retardant may include sodium carbonate ($Na_2CO_3$), sodium phosphate ($Na_3PO_4$), sodium phosphate dodecahydrate ($Na_3PO_4 \cdot ONa_2O$), sodium polyphosphate ($Na_5P_3O_{10}$), sodium pyrophosphate ($Na_4P_2O_7$), sodium pyrophosphate decahydrate ($Na_4P_2O_7 \cdot Nai_2O$), and ethylenediaminetetraacetic acid tetrasodium salt hydrate ($Na_4EDTAated_2O$). The reaction retardant may be used in an amount commonly used in the art.

The pH adjusting agent may adjust the pH of the etching solution to, for example, 10 or greater, particularly, 11.5 or greater. Aqueous ammonia, a sodium hydroxide solution, or the like may be used as the pH adjusting agent to adjust the pH of the etching solution to alkaline conditions.

The nanostructure prepared as described above may be subject to a post processing. The post processing may be plasma processing, corona discharge, UV-ozone, heating, pressing, and the like.

Figure 3:
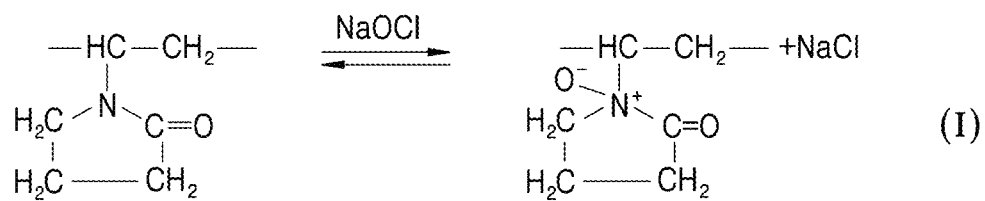
FIG. 3 is a diagram for describing a partial etching mechanism of a nanowire by using an etching solution including sodium hypochlorite (NaOCl)
Figure 3:
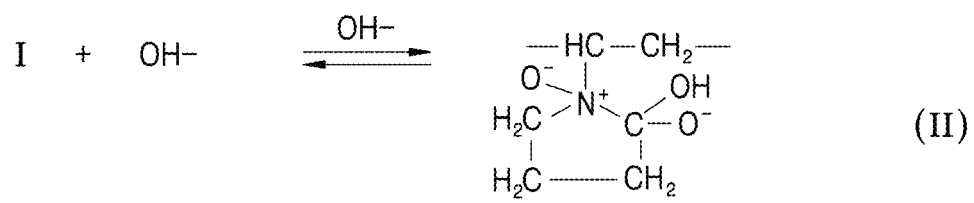
Figure 3:
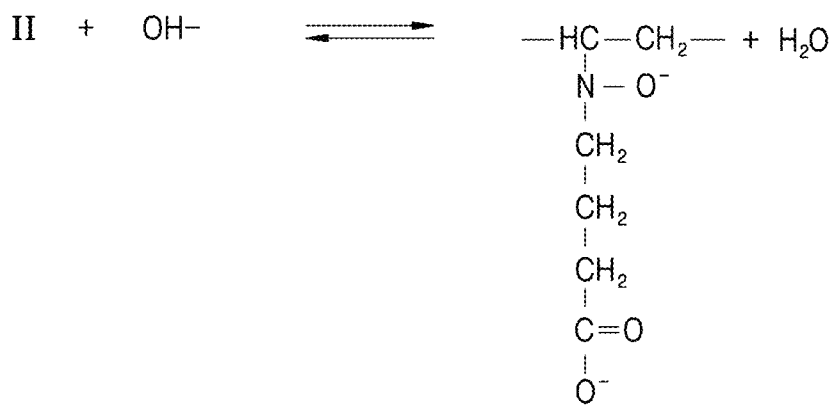

FIG. 3 is a diagram describing a mechanism of opening a polyvinyl pyrrolidone (PVP) ring via a reaction between PVP coated on the surface of the nanowire and the metal hypochlorite in an alkaline solution.

Referring to FIG. 3, Compound I and sodium chloride are produced via a reaction between PVP and sodium hypochlorite. Then, Compound II is produced from Compound I in the presence of hydroxide ions (OH). Then, the Compound II is involved in a reaction with the hydroxide ions (OH), thereby opening the PVP ring.

In the reactions, the hydroxide ions are supplied as reactants to open the PVP ring. Since chains of the polymer such as PVP are easily cut in the alkaline solution, an etching process including a PVP removing reaction may be relatively easily performed under alkaline conditions.

FIG. 4A is a schematic diagram illustrating a second nanowire in a nanostructure according to at least one example embodiment.

Referring to FIG. 4A, PVP film 41 is coated on a second nanowire 40 and 40' and is etched to form an electrically non-connected bridge 42. In this case, the electrically non-connected bridge 42 has a resistance of about $10^9 \Omega/\square$ or greater indicating non-conductivity. An average diameter of the electrically non-connected bridge 42 is equal to or less than 50%, for example, in a range of about 0.01 to about 30%, of the average diameter of the second nanowire 40 and 40a. Since the average diameter of the electrically non-connected bridge 42 is far less than the diameters of the other regions, the electrically non-connected bridge 42 is substantially nonconductive.

An insulating film may further be formed on the electrically non-connected bridge. Here, the insulating film may include at least one of silver chloride and silver oxide.

FIG. 4B is a schematic diagram illustrating a structure of a second nanowire according to at least one example embodiment.

Referring to FIG. 4B, the PVP film 41 coated on the second nanowire 40 is partially removed, and an insulating film 43 is formed between the second nanowires 40 and 40', thereby forming a nonconductive region.

According to a method of preparing a nanostructure including silver nanowires according to at least one example embodiment, the silver nanowires are partially disconnected or sectioned without having a change in diameter after etching the second nanowire to form the nonconductive region. Since this structure of the second nanowire may reduce changes in light scattering characteristics in the patterned silver nanowires and thus reduce changes in haze and transmittance in the patterned silver nanowires, visibility impairment may not occur.

By using an oxidant capable of uniformly removing the PVP film surrounding the silver nanowires, the silver nanowires may be uniformly broken while minimizing the change in the thickness of the silver nanowires. In addition, since the metal hypochlorite such as sodium hypochlorite may uniformly remove the PVP film in an alkaline solution having a pH of 11.5 or greater, the silver nanowires may be uniformly broken without changing the diameter of the silver nanowires. In addition, since an insulator such as silver chloride (AgCl) may be produced via a reaction between the metal hypochlorite and the silver ions of the nanowires after oxidization by using the etching solution including the metal hypochlorite, the partially etched silver nanowires, which become connected over time, may not be connected.

The fact that the difference of the average diameter between the second nanowire and the first nanowire has more influence on light scattering than the difference of the average length therebetween in the formation of the non-conductive region may be described as follows.

The haze of the silver nanowires is caused by light scattering around the silver nanowires.

The silver nanowires are regarded as an electric linear dipole based on Rayleigh scattering theory (Rayleigh dipole approximation). In this regard, a total scattering cross-section is determined by Formulae 1 to 3 below.

$$\sigma_{scat} = 2aL\frac{\pi^2}{4}\left|\frac{n^2-1}{n^2+1}\right|^2 q^3 \qquad \text{Formula 1}$$

$$n = n_p/n_m \qquad \text{Formula 2}$$

$$q = 2\pi a n_m/\lambda \qquad \text{Formula 3}$$

In Formulae 1 to 3, $\sigma_{scat}$ is a Rayleigh total scattering cross section, a is a radius of the silver nanowire, L is a length of the silver nanowire, in general, it is assumed that L>>a, $n_p$ is a complex refractive index of the silver nanowire, and $n_m$ is a refractive index of a medium surrounding the silver nanowire.

Referring to Formula 1, light scattering around the silver nanowires is proportional to the fourth power of the radius of the silver nanowire and proportional to the length of the silver nanowire. That is, as the diameter of the silver nanowire decreases, the haze decreases, and the length of the silver nanowire has lower influence on the haze than the diameter thereof.

$$\sigma_{scat} \propto d^4, \sigma_{scat} \propto L \qquad \text{Formula 4}$$

In Formula 4, $\sigma_{scat}$ is a Rayleigh total scattering cross-section.

FIG. 4C is a diagram illustrating variations of total scattering cross-section in a silver nanowire according to changes in shapes thereof by etching based on Rayleigh scattering theory. In FIG. 4C, the silver nanowire has a length of about 15 μm and a diameter of about 20 nm.

FIG. 4C illustrates variations in light scattering when the diameter and length of the nanowire are reduced to ⅔ of the original diameter and length thereof. When the diameter of the nanowire is not reduced by etching the nanowire, variations in light scattering, e.g., haze, may be considerably reduced. This theoretical results may be applied to partial etching of the nanowires according to at least one example embodiment. In order to reduce or substantially prevent visibility impairment occurring in the silver nanowires after patterning, differences of transmittance and haze before and after etching need to be reduced. Since the silver nanowire is broken only in the lengthwise direction thereof by etching without having a change in the diameter, the difference of haze is reduced after patterning of the silver nanowires, thereby reducing or substantially preventing visibility impairment.

A panel unit according to at least one example embodiment includes the nanostructure.

The nanostructure may be used as a transparent electrode replacing an ITO electrode.

Examples of the panel unit include flat panel displays (FPDs), touchscreen panels (TSPs), flexible displays, and foldable displays.

Examples of the FPD include liquid crystal displays (LCDs) and plasma display panels (PDPs).

The flexible display or foldable display has flexibility by replacing a substrate surrounding liquid crystals in LCDs with a plastic film. Since the flexible display or foldable display is thin and light, has high impact resistance, and is foldable or bendable, they may be manufactured in various shapes. In addition, since the flexible display or foldable display does not break even after being dropped due to these light and thin properties, it may be manufactured as a curved display and have a wide range of applications.

Examples of the flexible display include plasma display panels, liquid crystal display apparatuses, mobile phones, tablets, E-Paper, and wearable displays.

Figure 12:
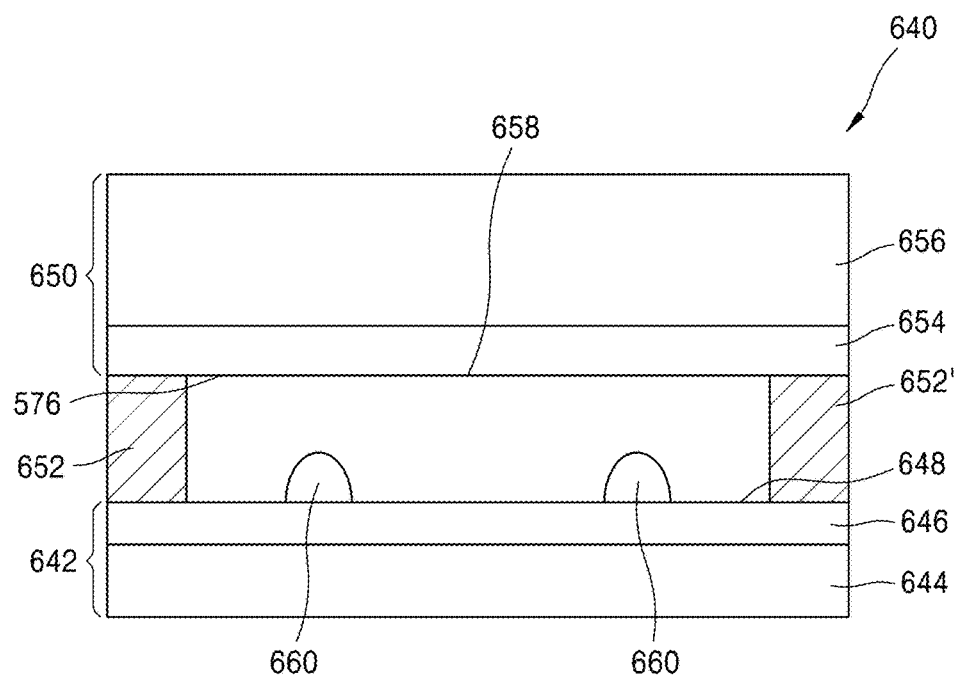
FIG. 12 is a schematic cross-sectional view illustrating a structure of a touchscreen panel including a nanostructure according to at least one example embodiment

FIG. 12 is a schematic cross-sectional view illustrating a structure of a touchscreen panel including a nanostructure according to at least one example embodiment.

Referring to FIG. 12, a touchscreen panel apparatus 640 includes a first substrate 644 coated with a first conductive layer 646 and having a top conductive surface 648.

An upper panel 650 is disposed to face a lower panel 642 and spaced apart therefrom by adhesive enclosures 652 and 652' disposed at ends of elements of the touchscreen panel apparatus 640. The upper panel 650 includes a second substrate 656 and a second conductive layer 654 coated or laminated on the second substrate 656. The second conductive layer 654 has an inner conductive surface 658 facing the conductive surface 648 and disposed above spacers 660.

When a user touches the upper panel 650, the inner conductive surface 658 electrically contacts the top conductive surface 648 of the lower panel 642. Accordingly, a contact resistance is generated to cause a change in a static electric field. A controller (not shown) senses the change, resolves coordinates of an actual touch, and transmits information thereof to an operating system.

At least one of the first conductive layer 646 and the second conductive layer 654 includes the nanostructure according to at least one example embodiment.

The touchscreen panel may be a capacity type touchscreen panel.

Figure 13:
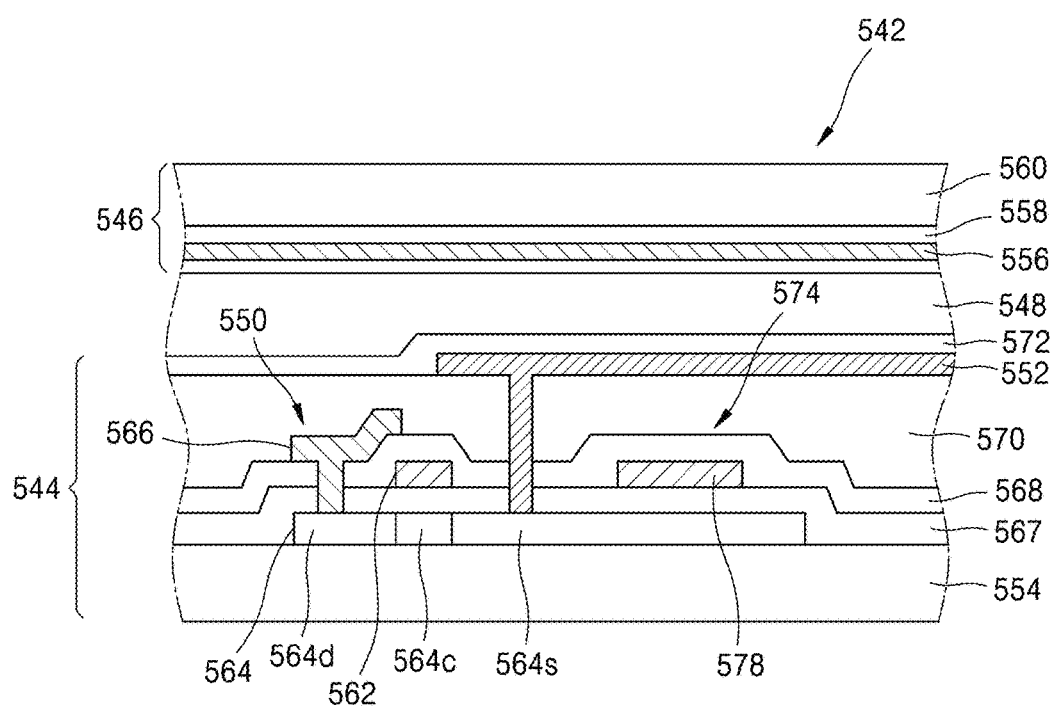
FIG. 13 is a schematic cross-sectional view illustrating a structure of a liquid crystal display (LCD) including a nanostructure according to at least one example embodiment.

FIG. 13 is a schematic cross-sectional view illustrating a structure of an LCD 542, one of the flat panel display panels, including a nanostructure according to at least one example embodiment.

The LCD illustrated in FIG. 13 is a liquid crystal display (LCD) including a top-gate type thin film transistor (TFT).

In a top-gate type TFT, a gate electrode is disposed on an active layer.

The LCD 542 includes a color filter substrate 546, a TFT substrate 544, and a liquid crystal layer 548 interposed therebetween. As described above, a TFT 550 and a pixel electrode 552 are arranged in a matrix configuration on a lower transparent substrate 554 in the TFT substrate 544. A common voltage may be applied to a common electrode 556, and a color filter 558 is disposed on a top transparent substrate 560. A voltage between the pixel electrode 552 and the common electrode drives liquid crystal cells (pixels), and the pixel electrode 552 and the common electrode 556 face the liquid crystal layer 548 interposed therebetween.

The TFT 550 disposed on the lower transparent substrate 554 to correspond to each pixel is a top-gate type TFT, and a gate electrode 562 is disposed on an active layer 564. The active layer 564 of the TFT 550 is patterned on the lower transparent substrate 554 by any method commonly used in the art. A gate insulating layer 567 is disposed on the active layer 564 to cover the active layer 564. A portion of the active layer 564 facing the gate electrode 562 is a channel region 564c. A drain region 564d and a source region 564s into which impurities are injected are disposed at both sides of the channel region 564c. The drain region 564d of the active layer 564 is connected to a data line, and the data line serves as a drain electrode 566 via a contact hole formed in an interlayer insulating layer 568 that covers the gate electrode 562. In addition, an insulating layer 570 is disposed to cover the data line and the drain electrode 566. The nanostructure according to at least one example embodiment constituting the pixel electrode 552 is disposed on the insulating layer 570. The pixel electrode 552 is connected to the source region 564s of the active layer 564 via a contact hole. A first alignment layer 572 may be disposed on the pixel electrode.

The nanostructure according to at least one example embodiment may also be applied to an LCD including a bottom-gate type TFT in addition to the LCD including the top-gate type TFT illustrated in FIG. 13. In the bottom-gate type TFT, an active layer may be disposed on a gate electrode differently from the top-gate type TFT.

The nanostructure according to at least one example embodiment is suitable for a display electrode in PDPs and electrically and optically stable at a high temperature of, for example, 300° C.

Figure 14:
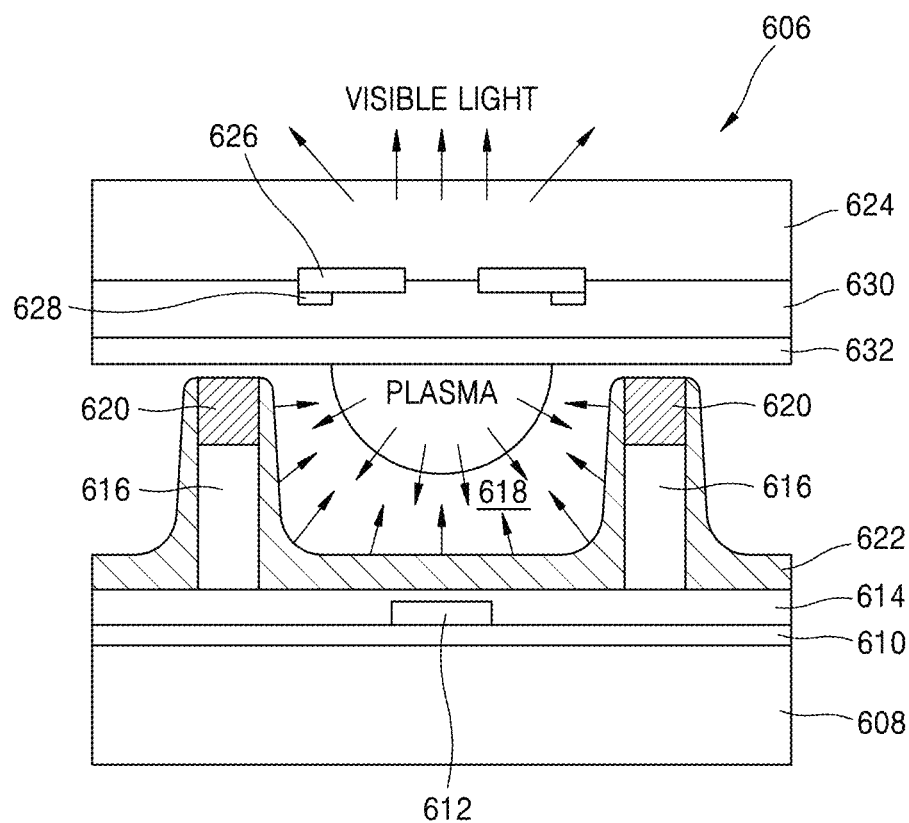
FIG. 14 is a schematic cross-sectional view illustrating a structure of a plasma display panel (PDP) including a nanostructure according to at least one example embodiment.

FIG. 14 is a schematic cross-sectional view illustrating a structure of a plasma display panel (PDP) 606, one of the flat panel display panels, including a nanostructure according to at least one example embodiment.

Referring to FIG. 14, the PDP 606 includes a lower transparent substrate 608, a lower insulating layer 610 formed on the lower transparent substrate 608, an address electrode 612 formed on the lower insulating layer 608, a lower dielectric layer 614 formed on the address electrode 612 and the lower insulating layer 610, insulating walls 616 defining a discharge cell 618, black matrix layers 620 disposed on the insulating walls 616, a fluorescent layer 622 formed on the black matrix layers 620, side walls of the insulating walls 616, and on the lower insulating layer 608, an upper transparent substrate 624, display electrodes 626 disposed on the upper transparent electrode 624 to be parallel to the address electrode 612, bus electrodes 628 respectively formed on one portion of the display electrode 626, an upper dielectric layer 630 formed on the bus electrode 628, the display electrode 626, and the upper transparent substrate 624, and a protective layer 632 (e.g., MgO) formed on the upper transparent substrate 630.

The display electrodes include the nanostructure according to at least one example embodiment and patterned.

The nanostructure according to at least one example embodiment may also be applied to photovoltaic cells, electronic light-emitting apparatuses, and the like.

Hereinafter, one or more example embodiments will be described in detail with reference to the following examples. These examples are not intended to limit the purpose and scope of disclosures.

Preparation Example 1: Preparation of Silver Nanowire Having Polyvinyl Pyrrolidone (PVP) Coating Film on the Surface Thereof $2\times10^{-2}$ g of platinum chloride ($PtCl_2$) was dissolved in 0.5 ml of ethylene glycol, and the reaction mixture was added to 5 ml of ethylene glycol and heated to about 160° C.

5 ml of an ethylene glycol solution of silver nitrate ($AgNO_3$) (0.05 g, Aldrich, 99+%) and 5 ml of an ethylene glycol solution of polyvinyl pyrrolidone (0.2 g, weight average molecular weight: 40,000) were added to the reaction mixture. The reaction mixture was heated at 160° C. for about 60 minutes.

The resulting mixture was cooled to room temperature (25° C.) and diluted by 10 times by adding acetone thereto. The diluted solution was centrifuged at about 2000 rpm for about 20 minutes to prepare silver nanowires on which a PVP coating film is formed.

TABLE 1

Etching solution, time and pH according to the below Examples

| | etching solution | etching time | pH |
|---|---|---|---|
| Example 1 | 15 wt % NaOCl + Deionized Water | 2.5 min | 6 |
| Example 2 | 15 wt % NaOCl + 1M CH3COOH(20 vol %) + Deionized Water | 3 min | 4 |
| Example 3 | 15 wt % NaOCl + 1M NaOH(10 vol %) + Deionized Water | 2.5 min | 11 |
| Example 4 | 2.0 wt % NaOCl + 1M CH3COOH(20 vol %) + Deionized Water | 3 min | 5.3 |
| Example 5 | 2.5 wt % NaOCl + 1M CH3COOH(20 vol %) + Deionized Water | 3 min | 5.4 |
| Example 6 | 3.33 wt % NaOCl + 1M CH3COOH(20 vol %) + Deionized Water | 30 sec | 5.6 |
| Example 7 | 5.0 wt % NaOCl + 1M CH3COOH(20 vol %) + Deionized Water | 30 sec | 5.8 |
| Example 8 | 2.5 wt % NaOCl + 1M CH3COOH(20 vol %) + Deionized Water | 30 sec | 5.4 |
| Example 9 | 15 wt % NaOCl + 1M NaOH(10 vol %) + Deionized Water | 2.5 min | 13 |
| Example 10 | 15 wt % NaOCl + 1M NaOH(10 vol %) + Deionized Water | 2.5 min | 12 |
| Example 11 | 15 wt % NaOCl + 0.1M NaOH(10 vol %) + Deionized Water | 7 min | 11 |

Example 1: Preparation of Nanostructure

The silver nanowires having the PVP coating film on the surfaces thereof were mixed with deionized water to prepare an aqueous dispersion of the silver nanowires.

The aqueous dispersion of the silver nanowires was coated on a Si substrate and dried to form a silver nanowire layer on a base material.

A matrix-forming composition was coated on the silver nanowire layer to form a matrix (overcoat film) on the silver nanowire layer to a thickness of about 100 nm, thereby preparing a conductive film. The matrix-forming composition was obtained by mixing 1 g of urethane acrylate and 9 g of a mixture solvent of diacetone alcohol and isopropyl alcohol at a volume ratio of about 1:1.

A photoresist film was formed on a first region of the conductive film and patterned to form a mask pattern on the first region of the conductive film. The second region of the conductive film on which the mask was not disposed was dipped in an etching solution for about 8 minutes by using the mask pattern as a mask, and the silver nanowires disposed in the second region of the conductive film were partially etched using the etching solution for about 2.5 minutes The etching solution containing sodium hypochlorite and deionized water was used, and the pH of the etching solution was about 6. The amount of sodium hypochlorite in the etching solution was about 15% by weight.

The etched resulting structure was washed with deionized water and dried to prepare a nanostructure.

Example 2: Preparation of Nanostructure

A nanostructure was prepared in the same manner as in Example 1, except that a solution prepared by adding 1 M acetic acid ($CH_3COOH$) to the etching solution of Example 1 was used, and etching time was about 3 minutes. In the etching solution, an amount of 1M acetic acid was 20% by volume, and the pH of the etching solution was about 4.

Example 3: Preparation of Nanostructure

A nanostructure was prepared in the same manner as in Example 1, except that a solution prepared by adding 1M sodium hydroxide to the etching solution of Example 1 was used, and etching time was about 2.5 minutes. In the etching solution, an amount of sodium hydroxide was 10% by volume, and the pH of the etching solution was about 11.

Example 4: Preparation of Nanostructure

The silver nanowires having the PVP coating film on the surfaces thereof were mixed with deionized water to prepare an aqueous dispersion of the silver nanowires.

The aqueous dispersion of the silver nanowires was coated on a Si substrate and dried to form a silver nanowire layer on a base material.

A photoresist film was formed on a first region of the silver nanowire layer and patterned to form a mask pattern on the first region of the silver nanowire layer. The second region of the conductive film on which the mask was not disposed was dipped in an etching solution for about 8 minutes by using the mask pattern as a mask, and the silver nanowires contained in a second region of the conductive film were partially etched for about 3 minutes. The etching solution was prepared by adding 1 M acetic acid ($CH_3COOH$) solution to a solution including sodium hypochlorite and deionized water, and the pH of the etching solution was about 5.3. In the etching solution, an amount of sodium hydroxide was 20% by volume, and the amount of the hypochlorite contained in the etching solution was about 2.0% by weight.

The etched resulting structure was washed with deionized water and dried to prepare a nanostructure.

Example 5: Preparation of Nanostructure

A nanostructure was prepared in the same manner as in Example 4, except that a solution was prepared using the etching solution of Example 4 such that the solution contained about 2.5% by weight of sodium hypochlorite (NaOCl), and the solution was used as an etching solution. The pH of the etching solution was about 5.4.

Example 6: Preparation of Nanostructure

A nanostructure was prepared in the same manner as in Example 4, except that a solution was prepared using the etching solution of Example 4 such that the solution contained about 3.33% by weight of sodium hypochlorite, the solution was used as an etching solution, and etching time was about 30 seconds. The pH of the etching solution was about 5.6.

Example 7: Preparation of Nanostructure

A nanostructure was prepared in the same manner as in Example 4, except that a solution was prepared using the etching solution of Example 4 such that the solution contained about 5.0% by weight of sodium hypochlorite, the solution was used as an etching solution, and etching time was about 30 seconds. The pH of the etching solution was about 5.8.

Example 8: Preparation of Nanostructure

A nanostructure was prepared in the same manner as in Example 4, except that a solution was prepared using the etching solution of Example 4 such that the solution contained about 2.5% by weight of sodium hypochlorite (NaOCl), the solution was used as an etching solution, and etching time was about 30 seconds. The pH of the etching solution was about 5.4.

Example 9: Preparation of Nanostructure

A nanostructure was prepared in the same manner as in Example 3, except that the pH of the etching solution was about 13.

Example 10: Preparation of Nanostructure

A nanostructure was prepared in the same manner as in Example 3, except that the pH of the etching solution was about 12.

Example 11: Preparation of Nanostructure

A nanostructure was prepared in the same manner as in Example 1, except that a solution prepared by adding 0.1 M of sodium hydroxide to sodium hypochlorite and deionized water was used as an etching solution, and etching time was about 7 minutes. The amount of the sodium hypochlorite in the etching solution was 15% by weight, and the amount of the sodium hydroxide contained in the etching solution was 10% by volume, and the pH of the etching solution was about 11.

TABLE 2

| | Etching solution and time according to the below Comparative Examples | |
|---|---|---|
| | etching solution | etching time |
| Comparative Example 1 | 91.8 wt % H3PO4 + 8.2 wt % HNO3 | 7 min |
| Comparative Example 2 | 67 wt % H3PO4 + 6.0 wt % HNO3 + 10 wt % CH3COOH + Deionized Water(Balance) + additives | 2 min |
| Comparative Example 3 | 67 wt % H3PO4 + 6.0 wt % HNO3 + 10 wt % CH3COOH + Deionized Water(Balance) + additives | 3 min |
| Comparative Example 4 | 67 wt % H3PO4 + 6.0 wt % HNO3 + 10 wt % CH3COOH + Deionized Water(Balance) + additives | 20 sec |

Comparative Example 1: Preparation of Nanostructure

A nanostructure was prepared in the same manner as in Example 1, except that a mixture of 91.8% by weight of phosphoric acid (H$_3$PO$_4$) and 8.2% by weight of nitric acid (HNO$_3$) was used as an etching solution, and etching was performed for 7 minutes.

Comparative Example 2: Preparation of Nanostructure

A nanostructure was prepared in the same manner as in Comparative Example 1, except that PMA-17A (Soulbrain, Co., Ltd., 67% by weight of phosphoric acid+6% by weight of nitric acid+10% by weight of acetic acid+additives+ deionized water (DI) (Balance)) was used as an etching solution, and etching time was about 2 minutes.

Comparative Example 3: Preparation of Nanostructure

A nanostructure was prepared in the same manner as in Comparative Example 2, except that etching time was about 3 minutes.

Comparative Example 4: Preparation of Nanostructure

A nanostructure was prepared in the same manner as in Comparative Example 2, except that etching time was about 20 seconds.

Evaluation Example 1: Optical Microscopy, Scanning Electron Microscopy, and Transmission Electron Microscopy 1) Example 3 and Comparative Examples 1 and 2

The nanostructures prepared according to Example 3 and Comparative Examples 1 and 2 were analyzed by optical microscopy and scanning electron microscopy. An S-5500 (Hitach) was used for scanning electron microscopy, and a Titan cubed 60-300 (FEI) was used for transmission electron microscopy.

Figure 5A:
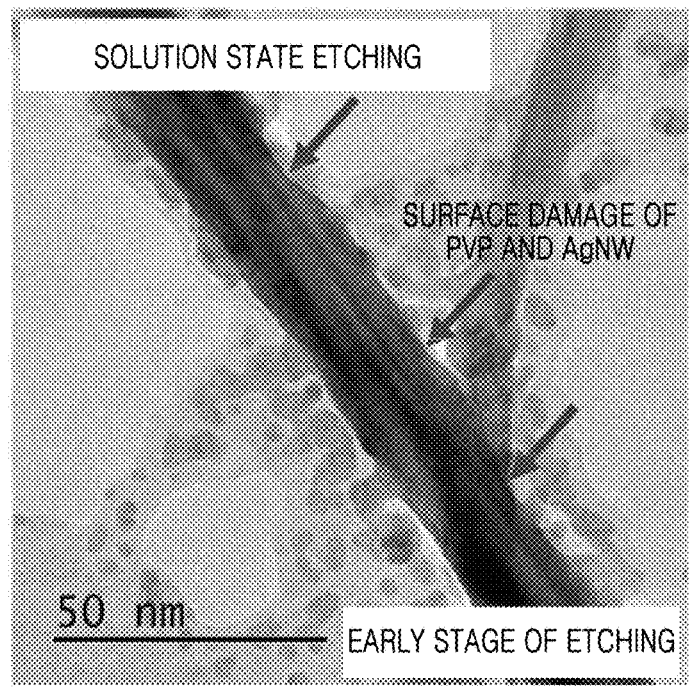
FIGS. 5A and 5B are a transmission electron microscopy (TEM) image of a nanowire prepared according to Example 3.
Figure 5B:
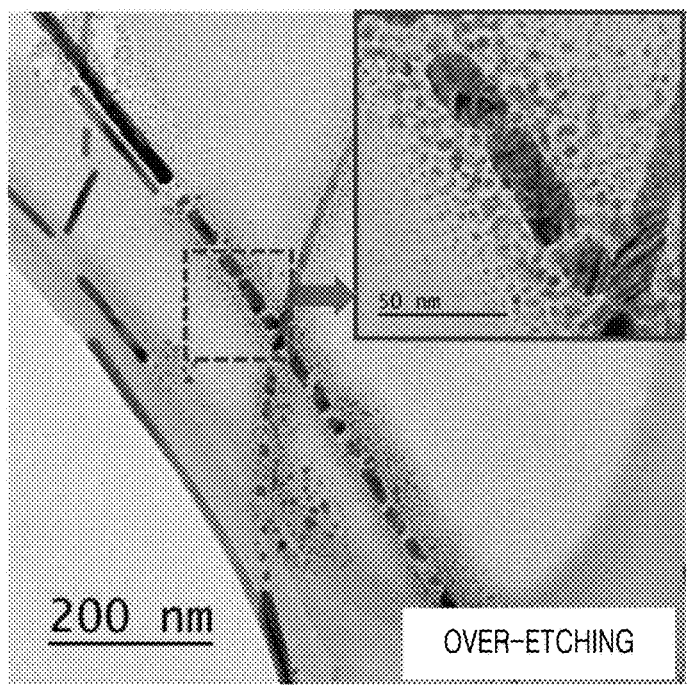
Figure 5C:
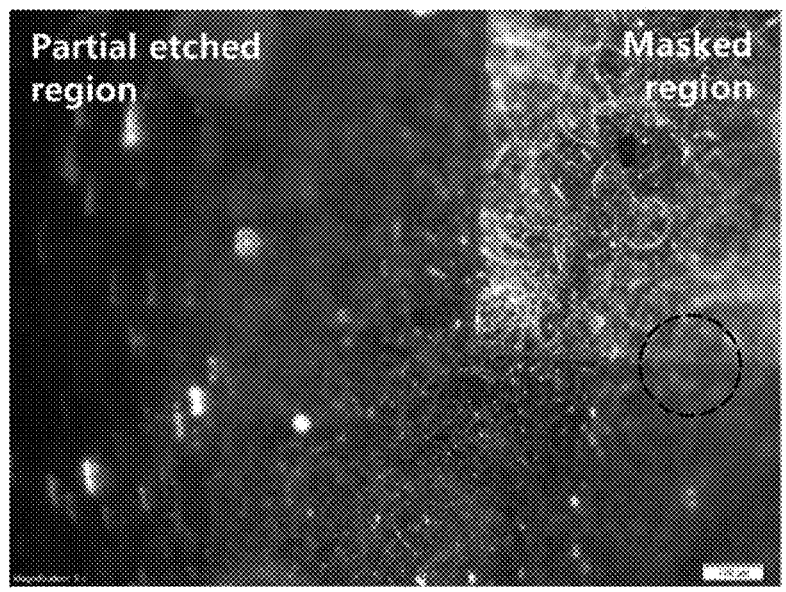
FIG. 5C is an optical microscopic image of a nanowire prepared according to Example 3.
Figure 5D:
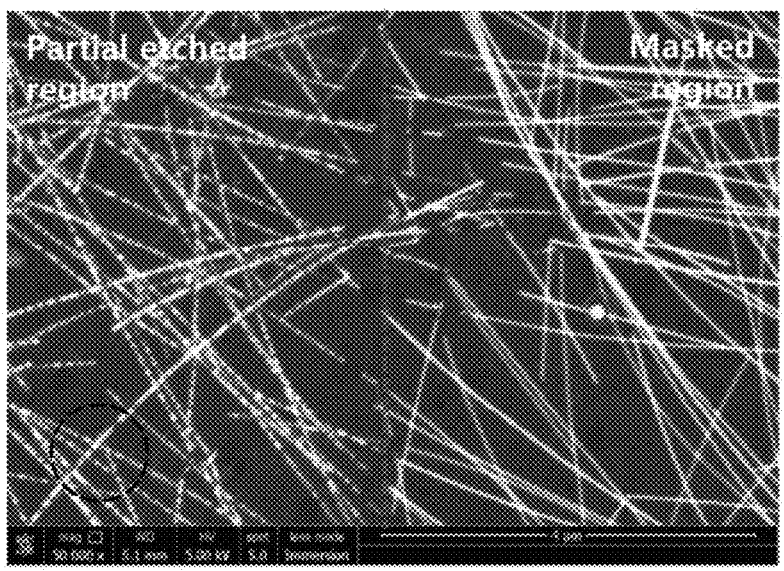
FIGS. 5D to 5E are scanning electron microscopic (SEM) images of a nanowire prepared according to Example 3.
Figure 5E:
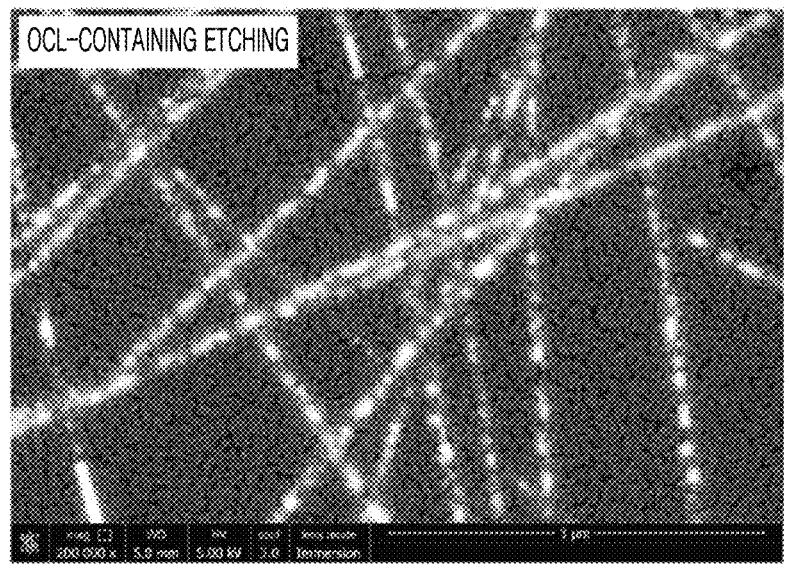
Figure 6:
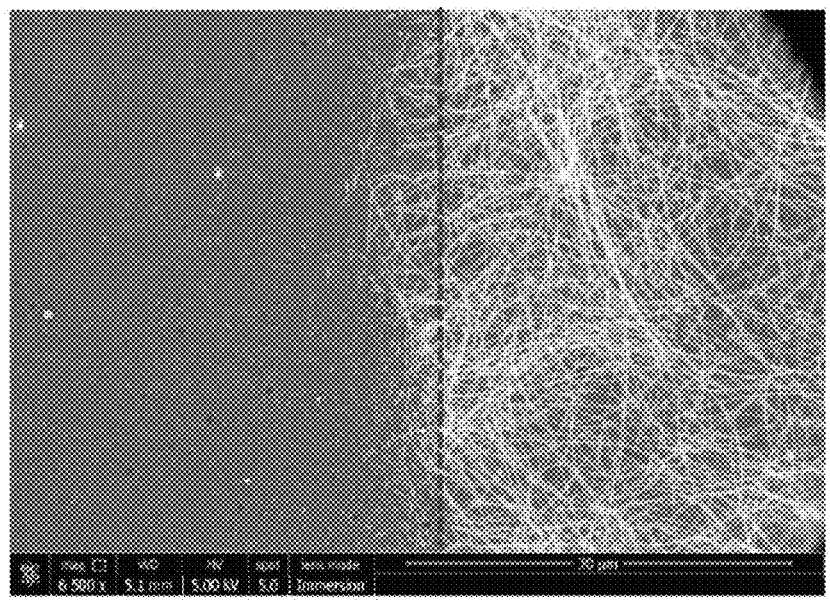
FIG. 6 is a SEM image of a nanowire prepared according to Comparative Example 1.
Figure 7A:
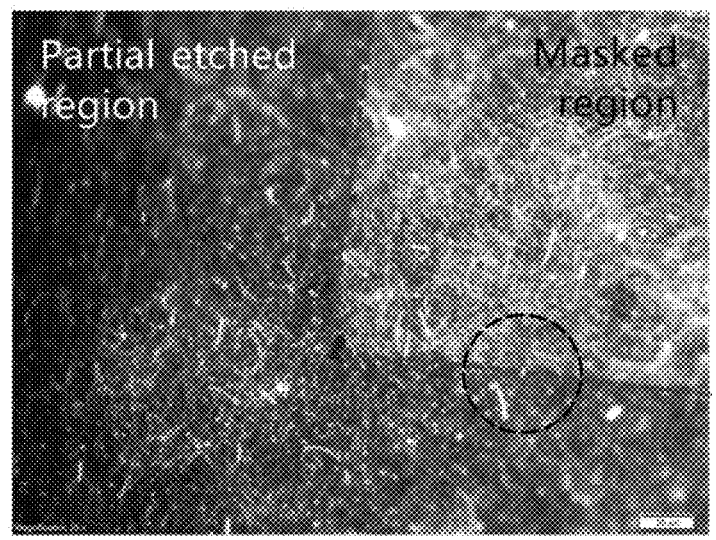
FIG. 7A an optical microscopic image of a nanowire prepared according to Comparative Example 2.
Figure 7B:
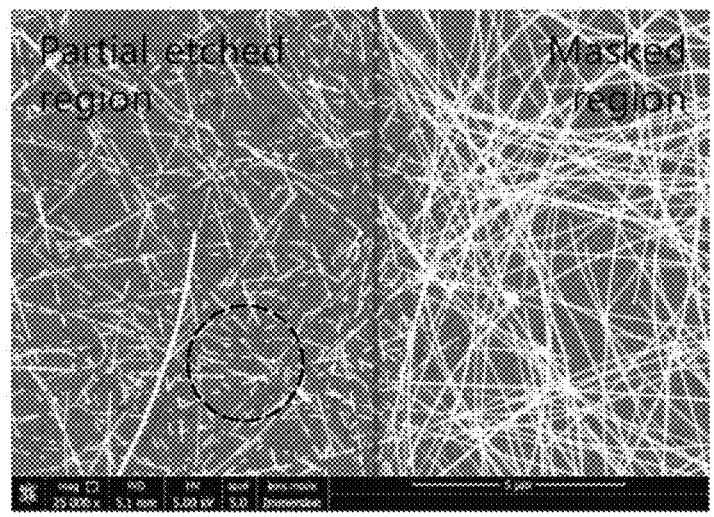
FIGS. 7B and 7C are SEM images of a nanowire prepared according to Comparative Example 2.
Figure 7C:
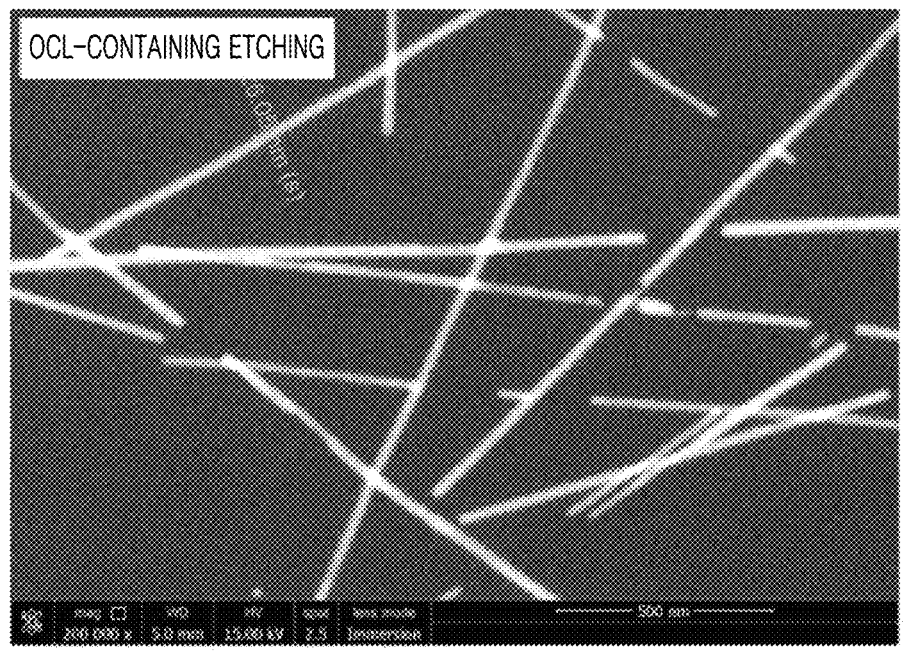

Scanning electron microscopic (SEM) images of the nanostructure prepared according to Example 3 are illustrated in FIGS. 5D to 5E. FIG. 6 is a SEM image of the nanostructure prepared according to Comparative Example 1. FIG. 7A to 7C illustrate result of an optical microscopy performed on the nanostructure prepared according to Comparative Example 2, and FIGS. 7B and 7C illustrate results of scanning electron microscopy performed on the nanostructure prepared according to Comparative Example 2. FIG. 7B illustrates an enlarged image of a portion of FIG. 7A marked with a circle. FIG. 7C illustrates an enlarged image of a portion of FIG. 7B marked with a circle.

In FIGS. 5D, 6, and 7B, left portions indicate etched regions, and right portions indicate non-etched regions.

As illustrated in FIG. 6, silver nanowires were not observed in the etched region of the nanostructure prepared according to Comparative Example 1 in which a mixture of nitric acid and phosphoric acid was used as the etching solution.

As illustrated in FIGS. 7A to 7C, a large amount of silver nanowires were observed in the etched region of the nanostructure prepared according to Comparative Example 2 in which a mixture of nitric acid, phosphoric acid, and acetic acid was used as the etching solution. A variety of variations were found in diameters and lengths of the silver nanowires, which are different from those of Example 3.

On the contrary, in the nanostructure prepared according to Example 3 shown in FIGS. 5C to 5E, it is difficult to distinguish the etched region from the non-etched region, and the silver nanowires have a uniform diameter and are partially disconnected or sectioned in the etched region. Thus, the patterns were insulated from each other. In addition, lengths of the broken second nanowires were relatively uniform. This is because chains of polyvinyl pyrrolidone are uniformly broken due to a reaction between sodium hypochlorite and polyvinyl pyrrolidone disposed on the surfaces of the silver nanowires in an alkaline solution.

2) Measurement of Average Diameter and Average Length of Nanowire

The nanostructures prepared according to Example 3 and Comparative Examples 1 and 2 were analyzed by scanning electron microscopy. The S-5500 (Hitachi) was used for scanning electron microscopy.

Deviations of the average length and the average diameter of each of the first nanowires and the second nanowires were measured using 10 lengths and 10 diameters of the first nanowires and the second nanowires by scanning electron microscopy. A difference of the average diameter between the first nanowire and the second nanowire and a difference of the average length between the first nanowire and the second nanowire were calculated using Formulae 5 and 6 below.

Difference of average diameter={average diameter of first nanowire (AgNW1)−average diameter of second nanowire (AgNW2))/average diameter of first nanowire (AgNW1)}×100     Formula 5

Difference of average length={average length of first nanowire (AgNW1)−average length of second nanowire (AgNW2))/average length of first nanowire (AgNW1)}×100     Formula 6

TABLE 3

| Example | Difference of average diameter (%) | Difference of average length (%) |
|---|---|---|
| Example 3 | 4.5 | 9 |
| Comparative Example 1 | 7 | 15 |
| Comparative Example 2 | 9 | 20 |

As illustrated in Table 3, in the nanostructure prepared according to Example 3, the difference of the average diameter between the first nanowire and the second nanowire was 5% or less, and the difference of the average length between the first nanowire and the second nanowire was 10% or less. On the contrary, in the nanostructure prepared according to Comparative Examples 1 and 2, the difference of the average diameter between the first nanowire and the second nanowire was greater than 5%, and the difference of the average length between the first nanowire and the second nanowire was greater than 10%.

In addition, in the nanostructures prepared according to Example 11 and Comparative Examples 3 and 4, a difference of the average diameter and a difference of the average length between the first nanowire and the second nanowire were calculated and shown in Table 4 below.

TABLE 4

| Example | Difference of average diameter (%) | Difference of average length (%) |
|---|---|---|
| Example 11 | 4.3 | 8 |
| Comparative Example 3 | 9 | 15 |
| Comparative Example 4 | 11 | 20 |

As shown in Table 4, in the nanostructure prepared according to Example 11, the difference of the average diameter between the first nanowire and the second nanowire was 5% or less, and the difference of the average length between the first nanowire and the second nanowire was 10% or less. On the contrary, in the nanostructures prepared according to Comparative Examples 3 and 4, the difference of the average diameter between the first nanowire and the second nanowire was greater than 5%, and the difference of the average length between the first nanowire and the second nanowire was greater than 10%.

3) Examples 1, 2, and 11 and Comparative Examples 3 and 4

The nanostructures prepared according to Examples 1, 2, and 11 and Comparative Examples 3 and 4 were analyzed by scanning electron microscopy. The S-5500 (Hitachi) was used for scanning electron microscopy.

FIGS. 15A to 15E are respective SEM images of etched regions of the nanostructures prepared according to Examples 1, 2, and 11 and Comparative Examples 3 and 4.

Figure 15A:
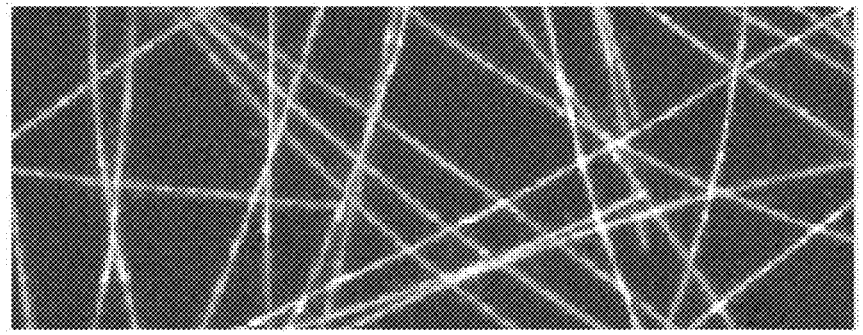
FIGS. 15A to 15E are SEM images of etched regions of nanostructures prepared according to Examples 1, 2, and 13 and Comparative Examples 3 and 4.
Figure 15B:
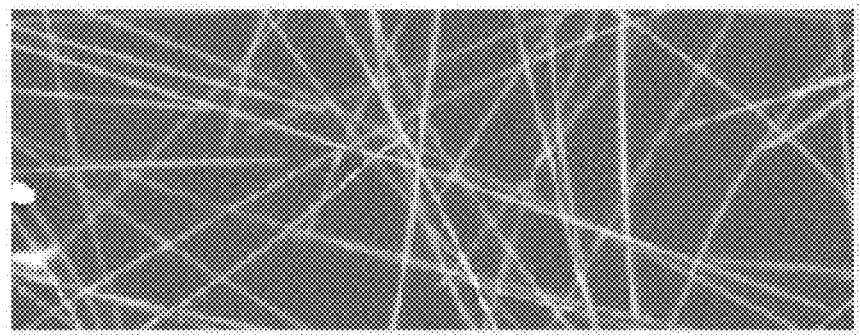
Figure 15C:
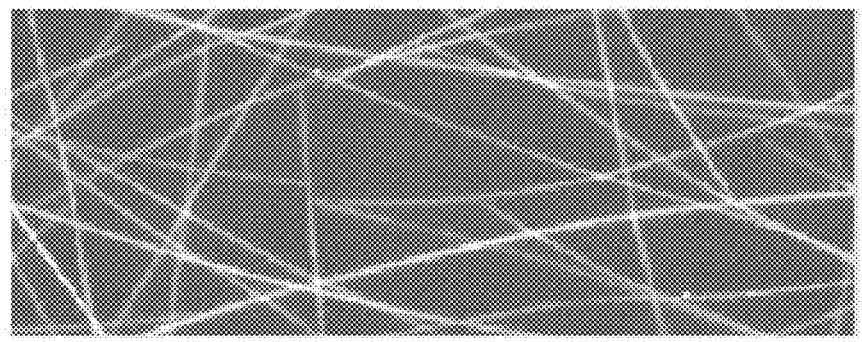
Figure 15D:
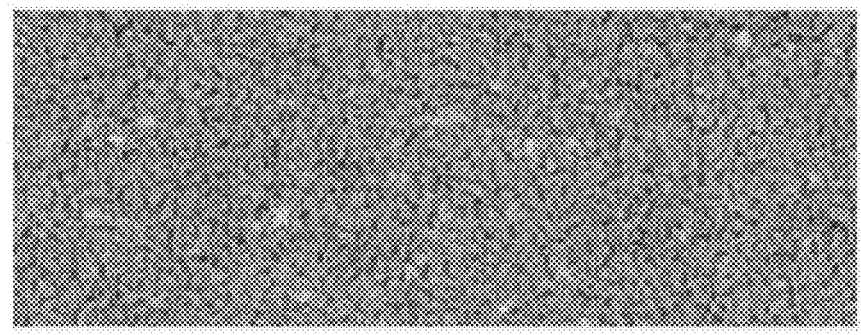
Figure 15E:
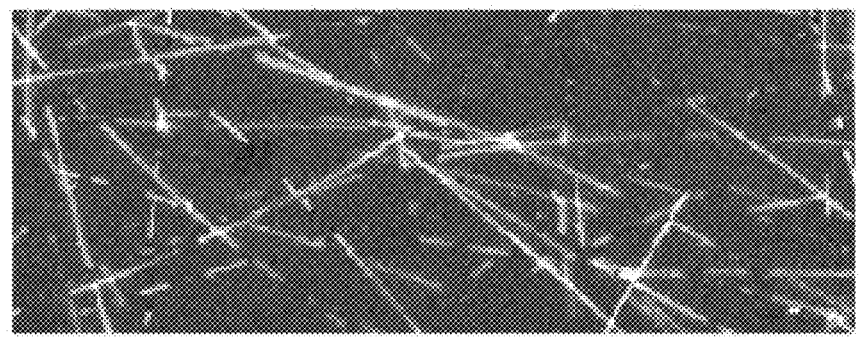
Figure 16A:
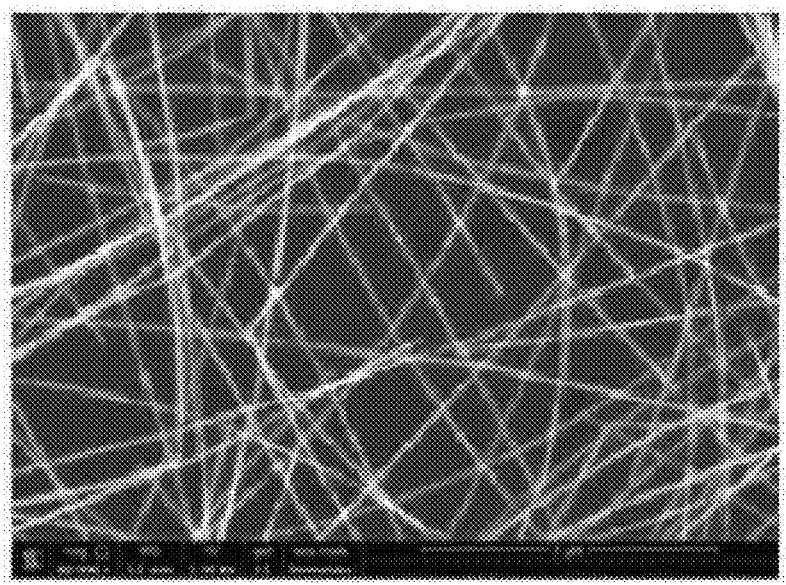
FIGS. 16A to 16E are SEM images of a nanostructure prepared according to Example 2 illustrating optical microstructural changes with respect to etching time.
Figure 16B:
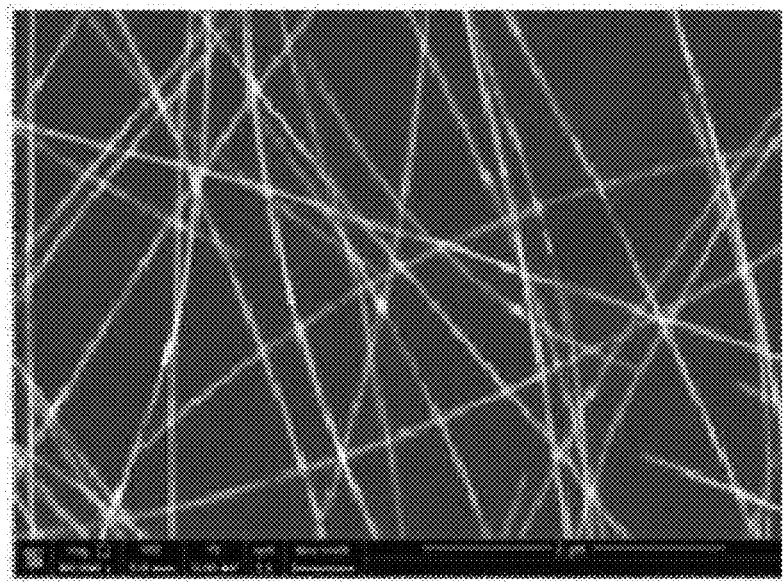
Figure 16C:
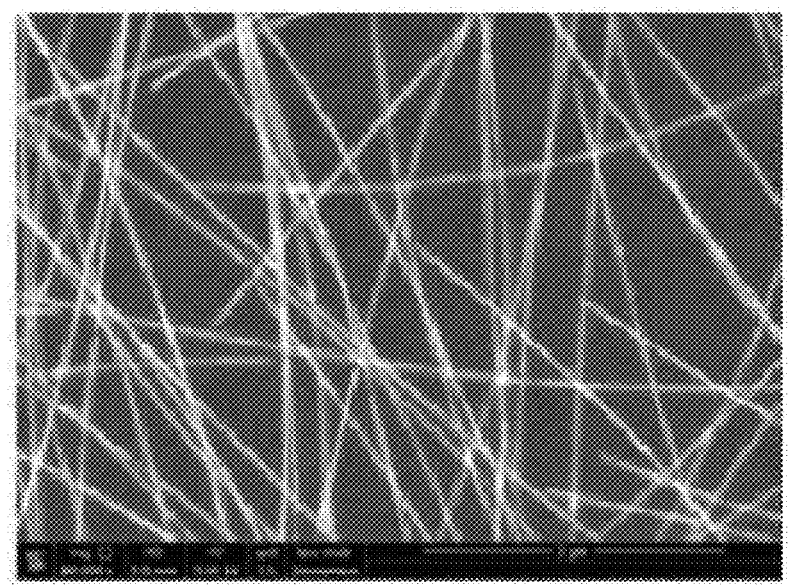
Figure 16D:
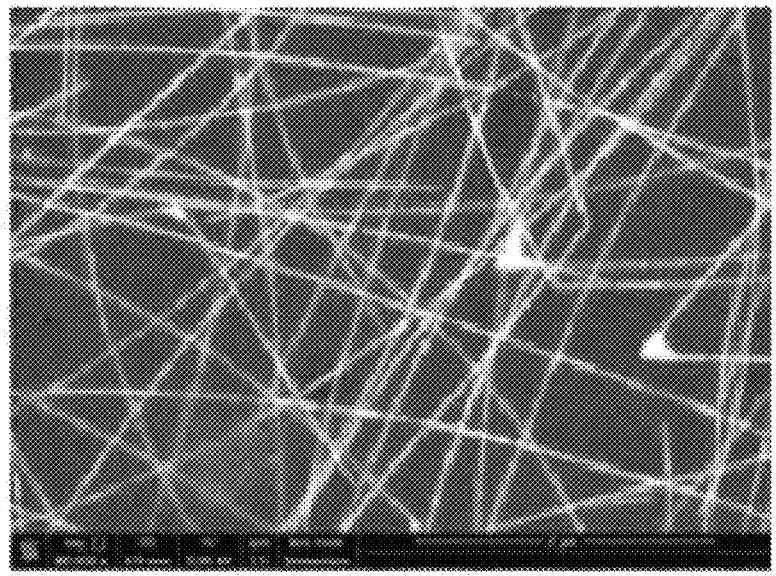
Figure 16E:
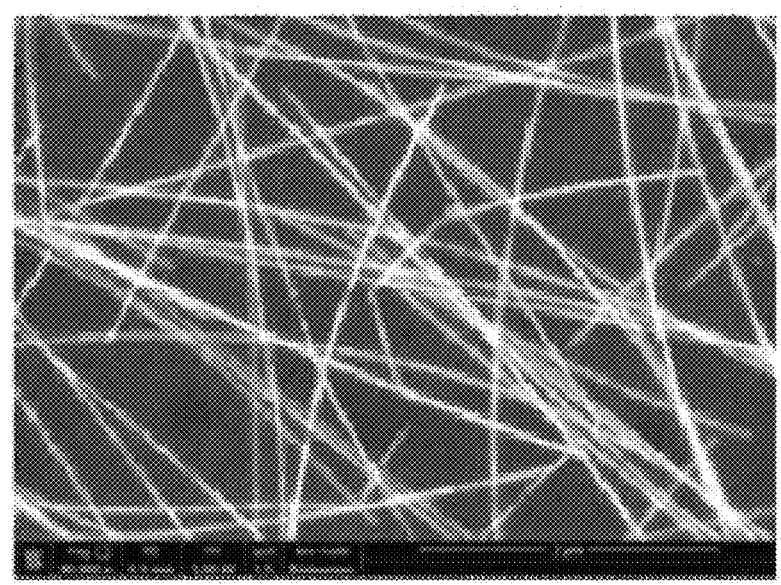

Referring to FIGS. 15A to 15C, the silver nanowires are relatively uniformly disposed in the etched regions of the nanostructures prepared according to Examples 1, 2, and 11. In Example 1, a solution including sodium hypochlorite was used as the etching solution, and in Example 2, a solution including sodium hypochlorite and acetic acid was used as the etching solution. Also, in Example 11, sodium hydroxide was added to the etching solution of Example 1, On the contrary, referring to FIGS. 15D to 15E, a variety of variations were found in diameters and lengths of the silver nanowires in the nanostructures prepared according to Comparative Examples 3 and 4 which is different from those according to Examples 1, 2, and 11. In Comparative Examples 3 and 4, PMA-17A was used as an etching solution. The etching time of Comparative Example 3 was about 3 minutes, and The etching time of Comparative Example 4 was about 20 seconds.

Evaluation Example 2: Optical Microscopy, Transmission Electron Microscopy, Optical Microscopy, Scanning Electron Microscopy, and Transmission Electron Microscopy

1) Examples 4 to 7

FIGS. 10A to 10D are respective Transmission electron microscopic (TEM) images of the nanowires prepared according to Examples 4 to 7 are illustrated. The Titan cubed 60-300 (FEI) was used for transmission electron microscopy. In Examples 4 to 7, the concentration of sodium hypochlorite were 2.0 weight %, 2.5 weight %, 3.33 weight %, and 5.0 weight %, respectively.

Referring to FIGS. 10A to 10D, the shape of the etched nanowire varies according to the amount of sodium hypochlorite used during etching. As described above, since the shape of the nanowire may be changed and etching time may be reduced by adjusting the concentration of sodium hypochlorite, the nanostructure may be efficiently mass-produced.

2) Example 3

FIG. 5C is an optical microscopic image of a nanostructure prepared according to Example 3, and TEM images thereof are as illustrated in FIGS. 5A and 5B.

FIG. 5A is TEM image of an early stage of etching the nanostructure according to Example 3. FIG. 5B is a TEM image illustrating an over-etched state. FIG. 5C is an optical microscopic image of a partially etched region and a masked region of the nanostructure prepared according to Example 3. FIGS. 5D and 5E are SEM images. FIG. 5D illustrates an enlarged portion of FIG. 5C marked with a circle, FIG. 5E illustrates an enlarged portion of FIG. 5D marked with a circle

3) Examples 6 and 8

Figure 11A:
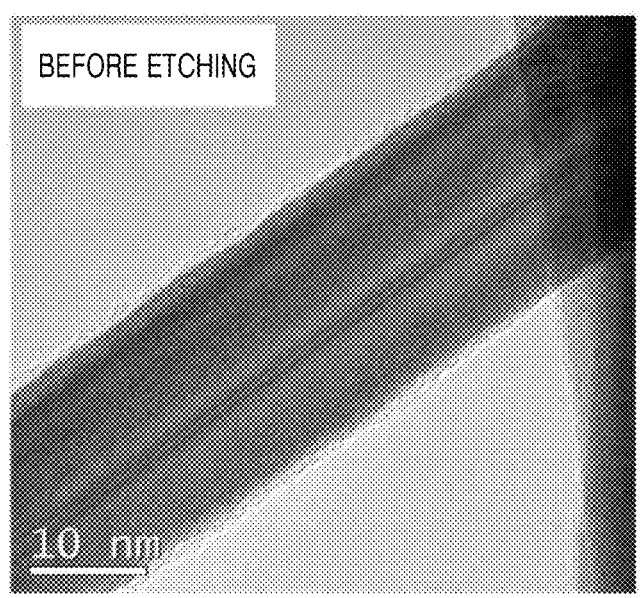
FIG. 11A is a transmission electron microscopic (TEM) image of a nanowire before etching.
Figure 11B:
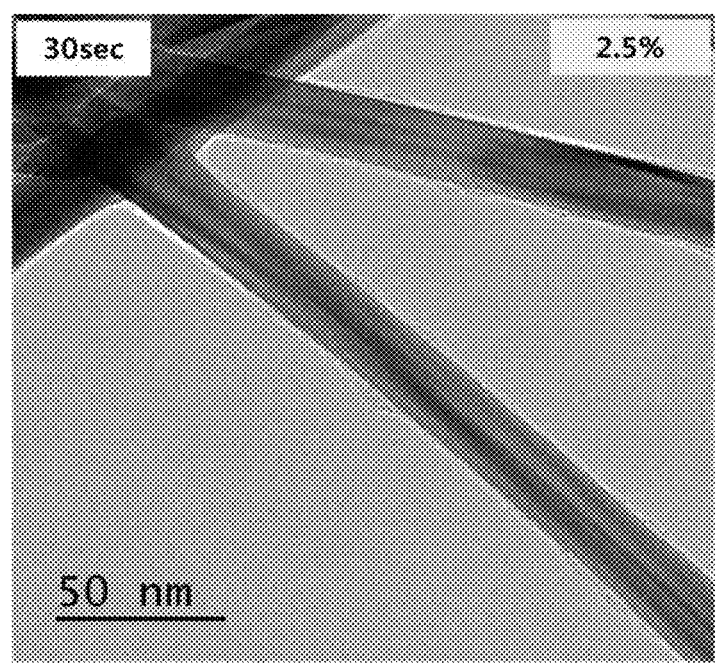
FIG. 11B is a TEM image of a nanowire prepared according to Example 6.
Figure 11C:
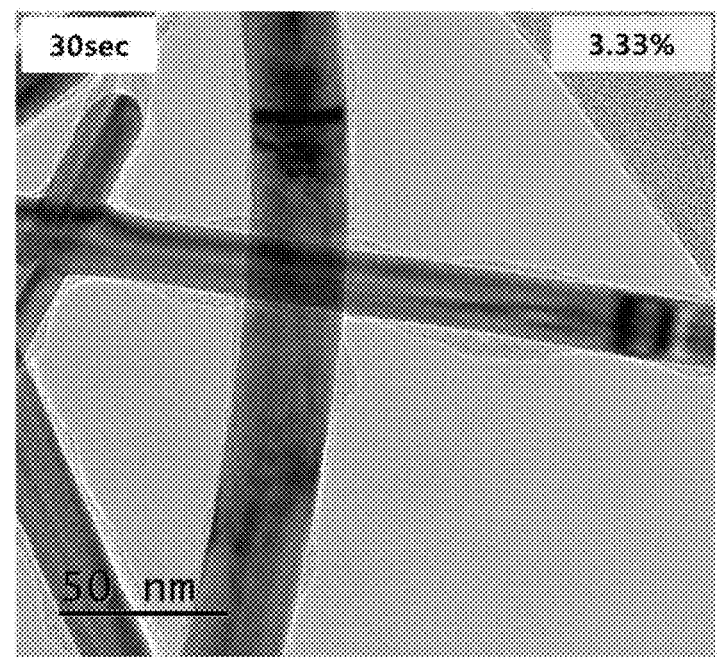
FIG. 11C is a TEM image of a nanowire prepared according to Example 8.

FIGS. 11B and 11C are TEM images illustrating the nanowires prepared according to Examples 6 and 8. FIG. 11A is a TEM image illustrating the nanowires before etching.

Referring to FIGS. 11A to 11C, PVP was etched in different ways according to the concentration of NaOCl. In addition, PVP is removed in different ways by adjusting the pH, and thus the length of the etched silver nanowires varies.

Evaluation Example 3: Measurement of Light Transmittance and Haze

1) Example 3 and Comparative Examples 1 and 2

Light transmittance, haze, and resistance of the nanostructures prepared according to Example 3 and Comparative Examples 1 and 2 were measured. In this regard, light transmittance and haze were measured using BYK Gardner Haze-gard Plus. Sheet resistance was measured using Fluke 175 True RMS Multimeter.

The results are shown in Table 5 below. In Table 5, the difference of transmittance is a difference of light transmittance of the nanostructure before and after etching, or a difference of light transmittance between the conductive region and the nonconductive region. In addition, the difference of haze is a difference of haze before and after etching, or a difference of haze between the conductive region and the nonconductive region.

TABLE 5

| | Light transmittance (%) ΔT (difference of transmittance) (%) | Haze (%) ΔH (difference of haze) (%) |
|---|---|---|
| Before etching | 90.6 | 1.04 |
| Example 3 | 90.7 | 0.9 |
| | 0.1 | 0.14 |
| Comparative Example 1 | 92.4 | 0.6 |
| | 1.8 | 0.44 |
| Comparative Example 2 | 92.1 | 0.55 |
| | 1.5 | 0.49 |

Referring to Table 5, the nanostructure prepared according to Example 3 had lower differences of transmittance and haze than the nanostructures prepared according to Comparative Examples 1 and 2, and thus visibility impairment may not occur in the nanostructure according to Example 3. Based on the results, when etching was performed according to Example 3, the silver nanowires were partially disconnected or sectioned without having a change in diameter thereof, and thus it was confirmed that visibility impairment did not occur. The results shown in Table 4 are obtained since light scattering around the silver nanowires depends more on a diameter variation of nanowires than on a length variation of the silver nanowires based on Rayleigh scattering theory. Due to low differences of transmittance and haze, visibility impairment occurring after patterning the silver nanowires may be reduced or substantially prevented. In addition, since an insulator of silver chloride is formed after etching by using a chlorine-based etching agent such as sodium hypochlorite, reliability of an insulating portion may be improved.

2) Examples 1, 2, and 11 and Comparative Examples 3 and 4

Light transmittance, haze, and resistance of the nanostructures prepared according to Examples 1, 2, and 11 and Comparative Examples 3 and 4 were measured. In this regard, light transmittance and haze were measured using BYK Gardner Haze-gard Plus. Sheet resistance was measured using Fluke 175 True RMS Multimeter.

The results are shown in Table 6 below. In Table 6, the difference of transmittance is a difference of light transmittance of the nanostructure before and after etching or a difference of light transmittance between the conductive region and the nonconductive region. In addition, the difference of haze is a difference of haze before and after etching between or a difference of haze between the conductive region and the nonconductive region.

TABLE 6

| Example | Visibility | |
| --- | --- | --- |
| | Δ T(%) | Δ H(%) |
| Example 1 | 0.04 | 0.039 |
| Example 2 | 0.06 | 0.07 |
| Example 11 | 0.08 | 0.016 |
| Comparative Example 3 | 1.54 | 0.696 |
| Comparative Example 4 | 0.98 | 0.429 |

In Table 6, Δ n refers to a difference of light transmittance before and after etching, and Δ r refers to a difference of haze before and after etching.

Based on Table 6, the nanostructures prepared according to Examples 1, 2 and 11 have lower differences of light transmittance and haze than the nanostructures prepared according to Comparative Examples 3 and 4, and thus visibility impairment does not occur.

Evaluation Example 4: Measurement of Sheet Resistance

Sheet resistance of the nanostructures prepared according to Example 1 and Comparative Example 1 was measured. Sheet resistance was measured using Fluke 175 True RMS Multimeter.

The difference of sheet resistance is a difference of sheet resistance between the etched region and the non-etched region.

The sheet resistance of the nanostructure prepared according to Comparative Example 1 was about 30Ω/☐ before etching and increased to 154.5Ω/☐ after etching.

On the contrary, a difference of sheet resistance of the nanostructure prepared according to Example 1 before and after etching was increased compared with that of the nanostructure prepared according to Comparative Example 1.

Evaluation Example 5: X-Photoelectron Spectroscopy (XPS) and High Angle Annular Dark Field Scanning Transmission Electron Microscopy (HAADF-STEM X-photoelectron spectroscopy (XPS) was performed on the nanostructure prepared according to Example 1 by using a Qunatum 2000 (Physical Electronics).

The results of the XPS are as illustrated in FIGS. 8A to 8F.

Figure 8A:
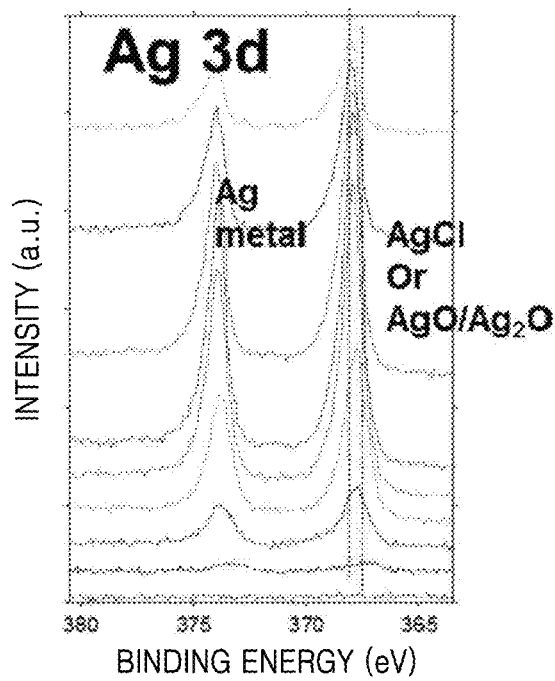
FIGS. 8A to 8F illustrate results of X-photoelectron spectroscopy of an etched region (nonconductive region) of a nanowire prepared according to Example 1.
Figure 8B:
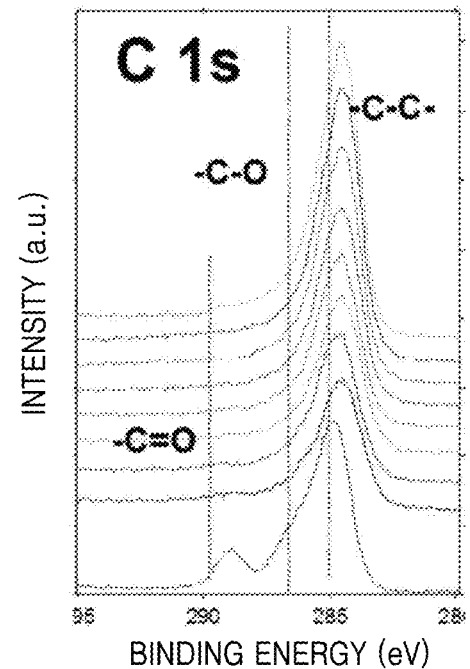
Figure 8C:
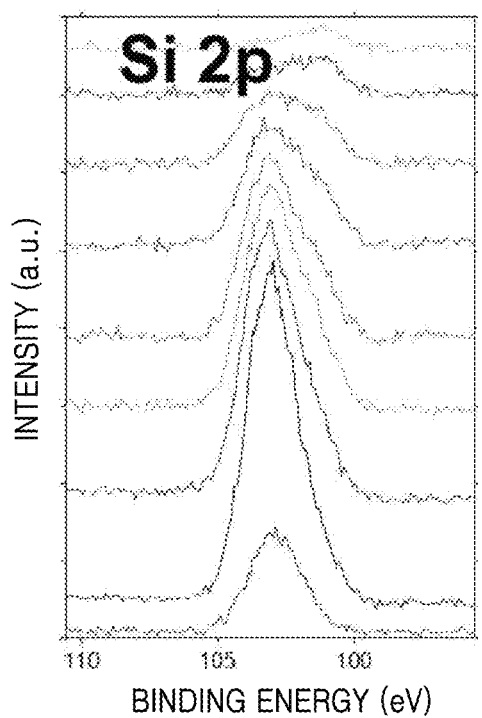
Figure 8D:
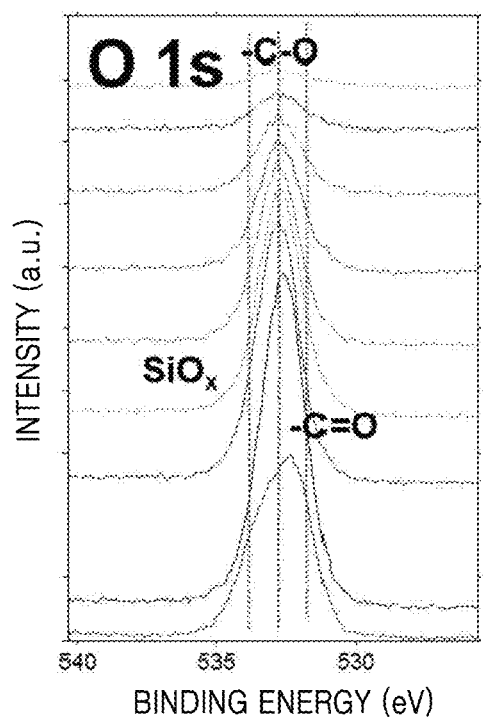

Referring to FIG. 8B, a chemical state of a polymer coated on the surfaces of the silver nanowires was not changed even after being etched.

Figure 8E:
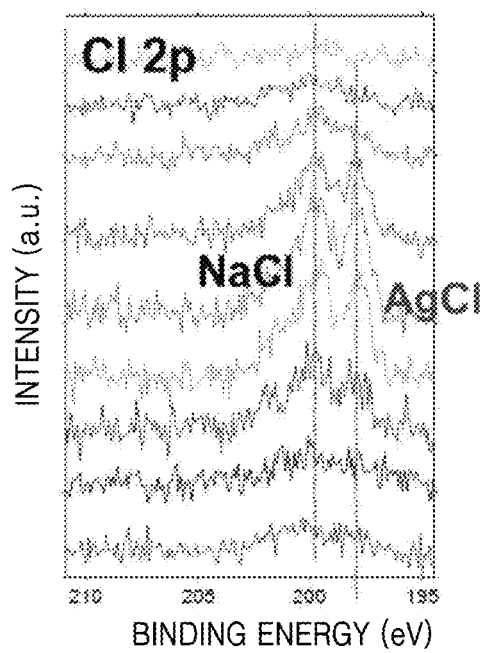
Figure 8F:
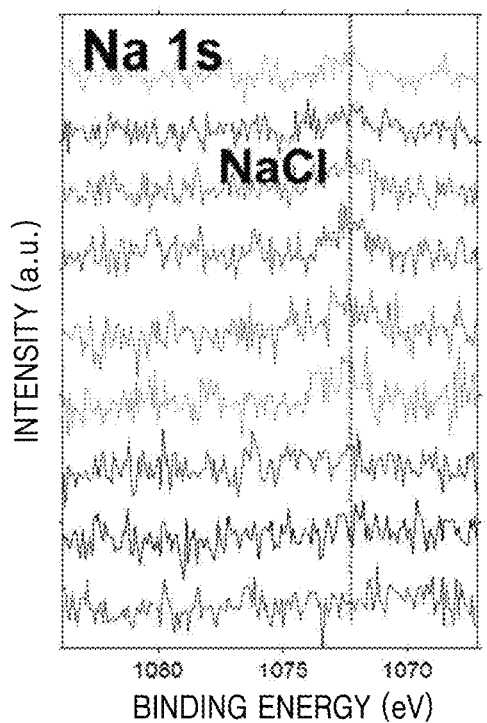

As illustrated in FIGS. 8A and 8E, silver chloride (AgCl) and sodium chloride (NaCl) were observed in regions where silver was detected. It was confirmed that a reaction between sodium hypochlorite and silver nanowires produces silver chloride and sodium chloride. Sodium chloride was removed via a sufficient washing process.

Figure 9A:
FIGS. 9A to 9C illustrate results of high angle annular dark field scanning transmission electron microscopy (HAADF-STEM) of an etched region (nonconductive region) of a nanowire prepared according to Example 3.
Figure 9B:
Figure 9C:
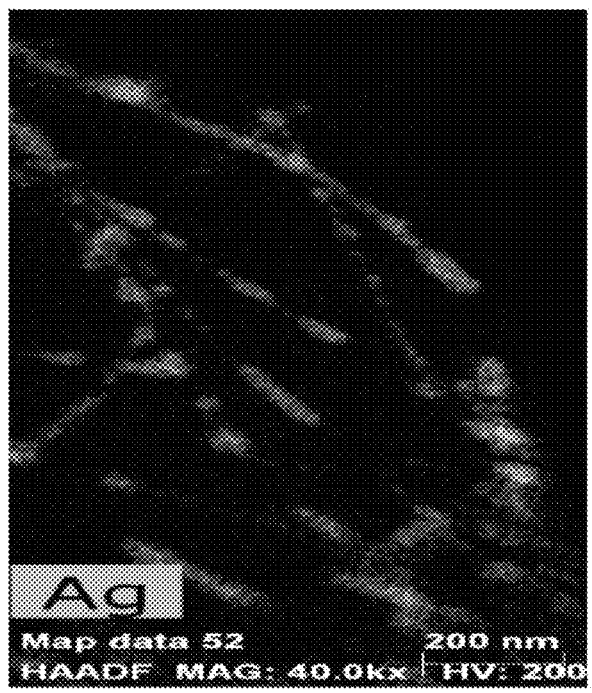
Figure 10A:
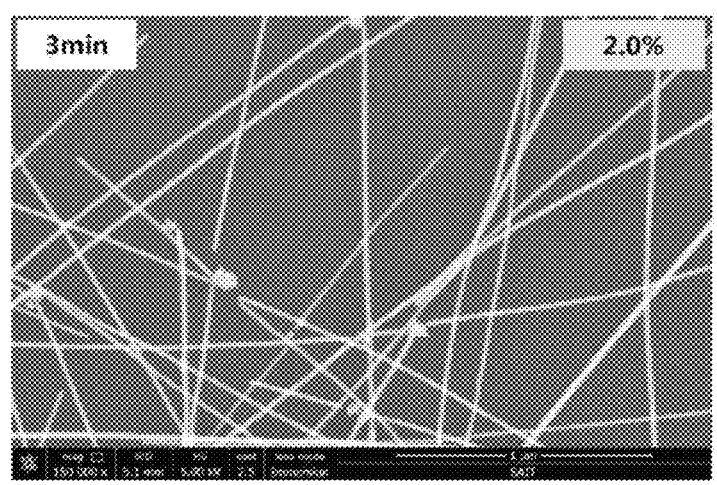
FIGS. 10A to 10D are SEM images of nanowires prepared Examples 4 to 6.
Figure 10B:
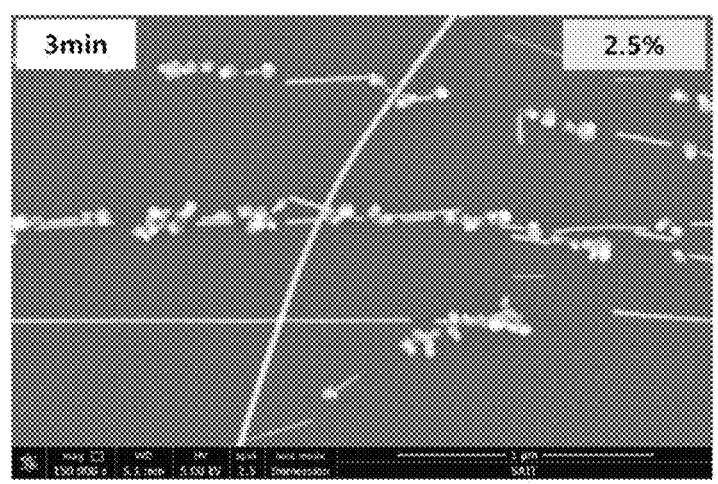
Figure 10C:
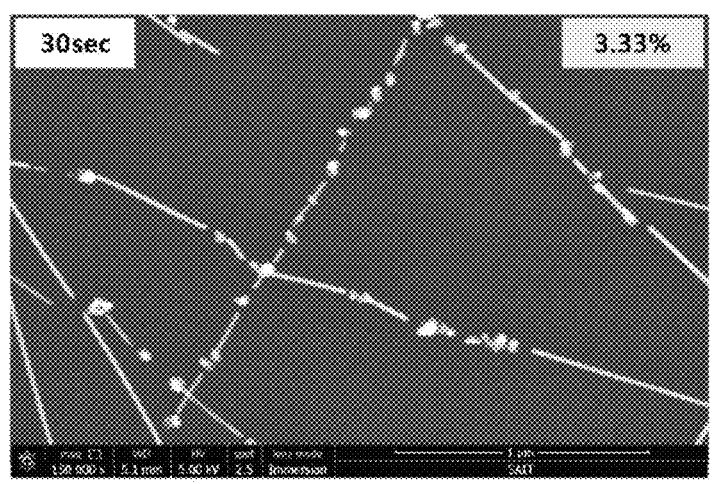
Figure 10D:
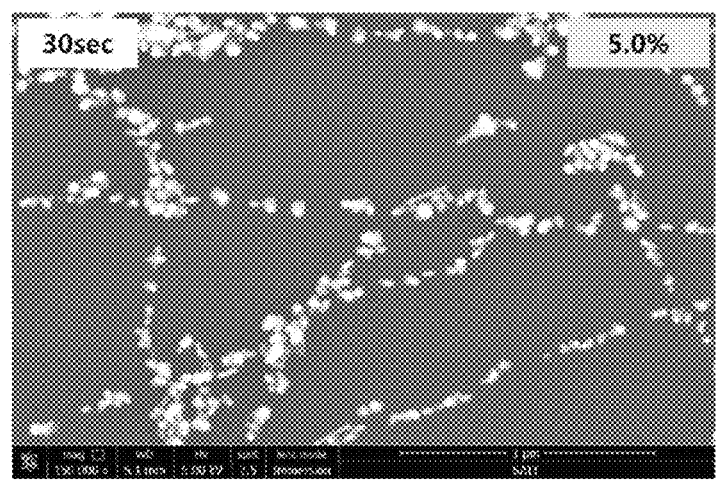

The results of the HAADF-STEM are as illustrated in FIGS. 9A to 9C. Referring to FIGS. 9A to 9C, the existence of silver and chlorine (CI) may be identified.

Evaluation Example 6: Time-Dependent Test

Time-dependent tests were performed on the silver nanowires prepared according to the nanostructures prepared according to Examples 5 and 6 and by evaluating wiring reliability.

In Table 7 below, the resistance variation was tested at 85° C. in a relative humidity of 85%. Wiring reliability of the silver nanowires was evaluated by measuring the resistance variation, and the results are shown in Table 7 below.

TABLE 7

| | Resistance variation (R) (%) | |
| --- | --- | --- |
| Example | 10 day | 18 day |
| Example 5 | 5.1 | 10.4 |
| Example 6 | 4.9 | — |

As shown in Table 7, when the silver nanowires prepared according to Examples 5 and 6 were used, wiring reliability was excellent.

Evaluation Example 7: Optical Microstructural Change Test

Optical microstructural changes of the nanostructure prepared according to Example 2 with respect to etching time were measured by scanning electron microscopy, and light transmittance, haze, and resistance of the nanostructure prepared according to Example 2 were measured. In this regard, light transmittance and haze were measured using BYK Gardner Haze-gard Plus. Sheet resistance was measured using Fluke 175 True RMS Multimeter. Sheet resistance was measured using Fluke 175 True RMS Multimeter FIGS. 16A to 16E are SEM images of the nanostructure prepared according to Example 2 illustrating optical microstructural changes over time. FIGS. 16A to 16E are SEM images illustrating states of the nanostructures at about 1 minute, at about 2 minutes, at about 3 minutes, at about 4 minutes, and at about 5 minutes after etching is initiated.

Figure 17:
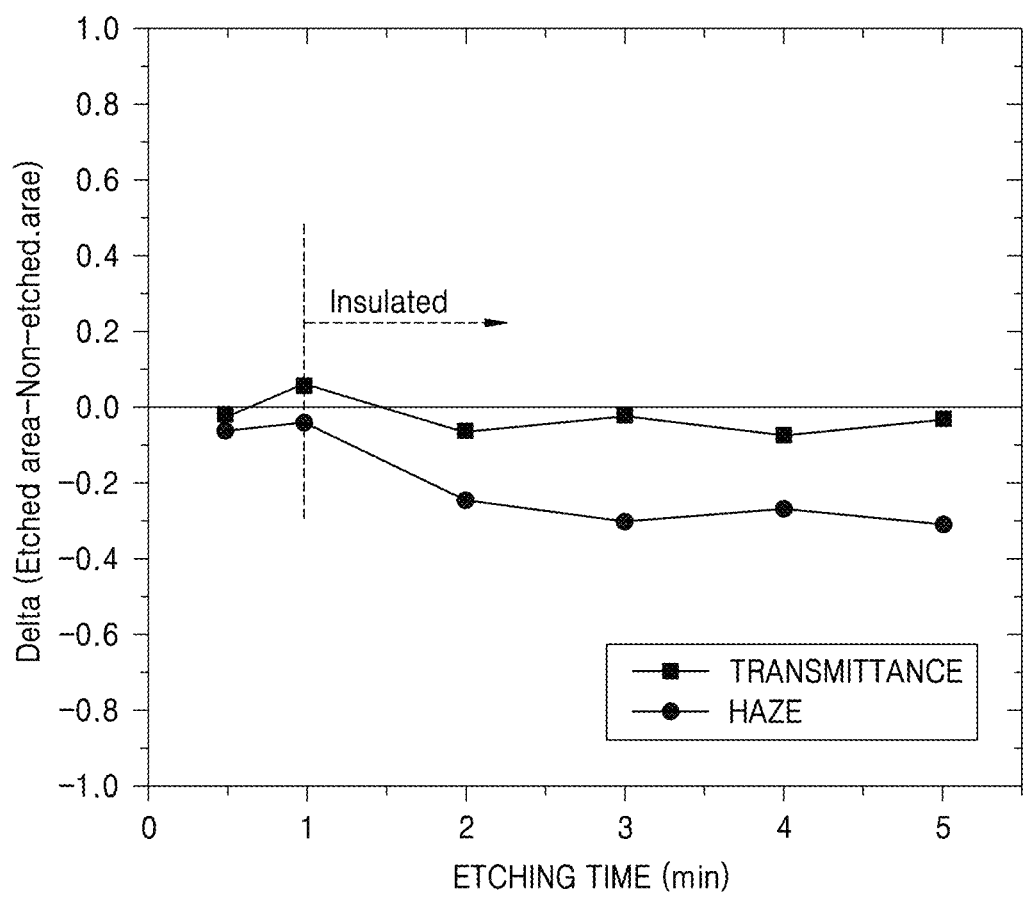
FIG. 17 is a graph illustrating differences of transmittance and haze between an etched region and a non-etched region of a nanostructure prepared according to Example 2.

Differences of transmittance and haze between the etched region and the non-etched region of the nanostructure prepared according to Example 2 were measured and the results are shown in FIG. 17. In FIG. 17, Delta (etched area-non-etched area) indicates differences of transmittance and haze between the etched area and the non-etched area.

Referring to FIG. 17, when the etching according to Example 2 was used, light transmittance and haze were not significantly changed after 1 minute, when the etched region is insulated, and the etched shape of AgNW was not considerably changed even after over-etching for 5 minutes. Thus, light transmittance and haze were not significantly changed.

When a conventional etching solution is used, the difference of haze increases by over-etching, thereby causing visibility impairment. However, since the silver nanowires were not changed by using the etching solution having the pH of 4, haze was not changed and visibility impairment did not occur. The insulating film is formed on the surface of the nanowire, and thus duration of a transparent electrode including the silver nanowires may be improved without having an influence of the etching solution.

Evaluation Example 8: Evaluation of Reliability

Figure 18A:
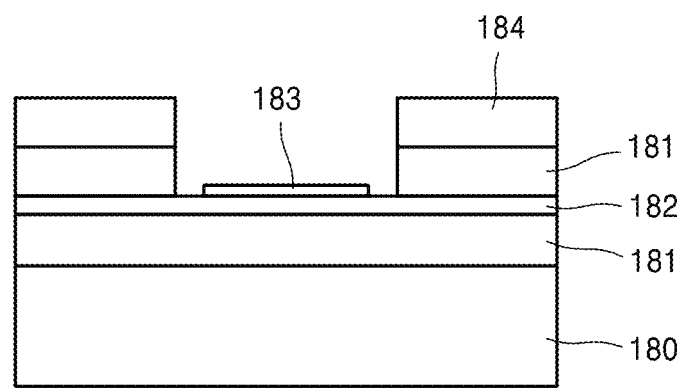
FIG. 18A is schematic cross-sectional view of a device used for evaluation of reliability in Evaluation Example 8.

The nanostructures prepared according to Example 1 and Comparative Example 4 were etched and packaged as a device as illustrated in FIG. 18A, and reliability thereof was evaluated.

The device illustrated in FIG. 18A includes a glass substrate 180, an optical clear adhesive (OCA) 181, the nanostructure 182 prepared according to Example 1 or Comparative Example 6, and a polyethylene terephthalate (PET) film 184 Here, a reference number 183 denotes a metal interconnect such as Ag interconnect.

Figure 18B:
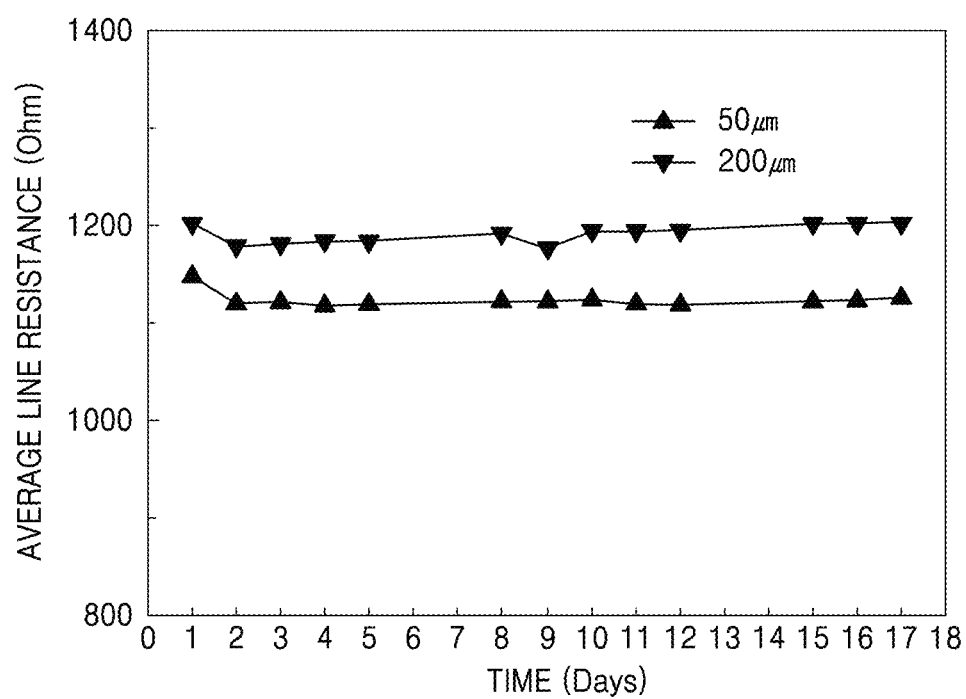
FIG. 18B is a graph illustrating results of reliability evaluation of nanostructure prepared according to Example 1.
Figure 18C:
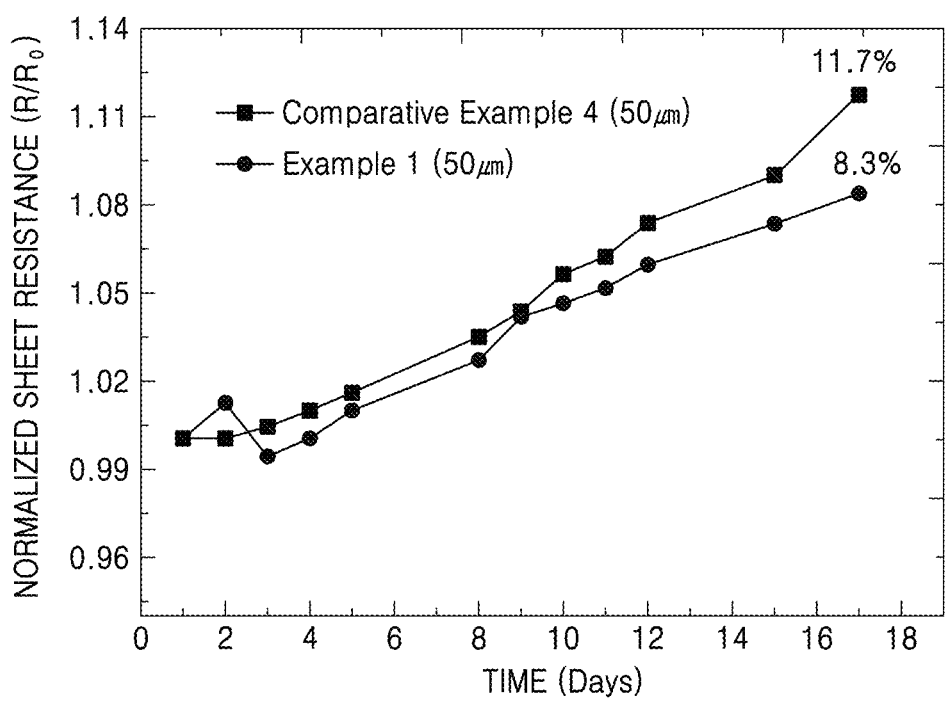
FIG. 18C is a graph illustrating results of reliability evaluation of nanostructures prepared according to Example 1 and Comparative Example 4.

The results of reliability evaluation are as illustrated in FIGS. 18B and 18C. In FIG. 18B, 50 μm and 200 μm each indicate the nanostructures prepared according to Example 1 having a thickness of 50 μm and 200 μm, respectively.

In FIG. 18C, Example 1 (50 μm) and Example 4 (50 μm) each indicate the nanostructures (having a thickness of 50 μm, respectively) prepared according to Example 1 and Comparative Example 4 measured in a film state.

Referring to FIG. 18B, as a result of reliability test, the resistance variation of the nanostructures prepared according to Example 1 was 1% or less.

Referring to FIG. 18C, the nanostructure prepared according to Example 1 exhibited a lower time-dependent change than the nanostructure prepared according to Comparative Example 4, thereby having improved reliability.

As described above, according to the nanostructure according to one or more of the above example embodiments, visibility impairment may be reduced or substantially prevented due to small differences of transmittance and haze between patterns.

It should be understood that the example embodiments described herein should be considered in a descriptive sense only and not for purposes of limitation. Descriptions of features within each example embodiment should typically be considered as available for other similar or same features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A nanostructure comprising;
a conductive region; and
a nonconductive region, the conductive region and the nonconductive region not overlapping in a planar direction;
wherein the conductive region includes at least one first nanowire, and
the nonconductive region includes at least one second nanowire that is at least partially disconnected.

2. The nanostructure of claim 1, wherein an average diameter of the second nanowire is lower than an average diameter of the first nanowire, and a difference in the average diameters between the first nanowire and the second nanowire is about 5% or less.

3. The nanostructure of claim 1, wherein an average length of the second nanowire is lower than an average length of the first nanowire, and a difference in the average lengths between the first nanowire and the second nanowire is about 10% or less.

4. The nanostructure of claim 1, wherein a difference in sheet resistances between the nonconductive region and the conductive region is about $10^9$ Ω/cm or greater.

5. The nanostructure of claim 1, wherein a deviation of an average diameter of the second nanowire is in a range of about 5 nm to about 10 nm.

6. The nanostructure of claim 1, wherein a deviation of an average length of the second nanowire is in a range of about 2 μm to about 10 μm.

7. The nanostructure of claim 1, wherein an aspect ratio of the second nanowire is in a range of about 1 to about 500.

8. The nanostructure of claim 1, wherein an aspect uniformity of the second nanowire is about 90% or greater.

9. The nanostructure of claim 1, further comprising:
an insulating film on at least one portion of a surface of the second nanowire.

10. The nanostructure of claim 9, wherein the insulating film comprises at least one of silver chloride (AgCl) and silver oxide.

11. The nanostructure of claim 1, further comprising:
a polymer film on at least one portion of surfaces of the first nanowire and the second nanowire.

12. The nanostructure of claim 11, wherein the polymer film comprises at least one of polyvinyl pyrrolidone, polyacetylene, polypyrrole, polythiophene, polyaniline, polyfluorolene, poly(3-alkylthiophene), poly(3,4-ethyleneoxythiophene), polynaphthalene, poly(p-phenylene), and poly (p-phenylene vinylene).

13. The nanostructure of claim 1, wherein an average diameter of the second nanowire is in a range of about 9.5 nm to about 95 nm, and an average length of the second nanowire is in a range of about 2.4 μm to about 80 μm.

14. The nanostructure of claim 1, wherein a haze of the nonconductive region is less than a haze of the conductive region, and a difference between the haze of the nonconductive region and the haze of the conductive region is about 0.2% or less.

15. The nanostructure of claim 1, wherein an average diameter of the first nanowire is in a range of about 10 nm to about 100 nm, and an average length of the first nanowire is in a range of about 3 μm to about 200 μm.

16. The nanostructure of claim 1, wherein an average diameter of the at least one second nanowire is substantially smaller than an average diameter of the at least one first nanowire.

17. The nanostructure of claim 1, wherein the nonconductive region further comprises an insulating portion between a plurality of second nanowire sections.

18. The nanostructure of claim 1, wherein the first nanowire and the second nanowire respectively comprise at least one of iron (Fe), platinum (Pt), nickel (Ni), cobalt (Co), aluminum (Al), silver (Ag), gold (Au), copper (Cu), silicon (Si), germanium (Ge), cadmium sulfide (CdS), cadmium selenide (CdSe), cadmium telluride (CdTe), zinc sulfide (ZnS), zinc selenide (ZnSe), zinc tellurid (ZnTe), gallium nitride (GaN), gallium phosphide (GaP), gallium arsenide (GaAs), gallium antimonide (GaSb), aluminum nitride (AlN), aluminum phosphide (AlP), aluminum arsenide (AlAs), aluminum antimonide (AlSb), indium phosphide (InP), indium arsenide (InAs), indium antimonide (InSb), silicon carbide (SiC), iron-platinum (FePt), ferric oxide ($Fe_2O_3$), and ferrous oxide ($Fe_3O_4$).

19. The nanostructure of claim 1, wherein a transmittance of the nonconductive region is greater than a transmittance of the conductive region, and a difference between the transmittance of the nonconductive region and the transmittance of the conductive region is about 0.1% or less.

20. The nanostructure of claim 1, further comprising a matrix.

21. The nanostructure of claim 20, wherein the matrix comprises at least one of a polyurethane-based resin, a polyester-based resin, an acrylic resin, a polyether-based resin, a cellulose-based resin, a polyvinyl alcohol-based resin, an epoxy-based resin, polyvinyl pyrrolidone, a polystyrene-based resin, and polyethylene glycol.

22. A panel unit comprising the nanostructure according to claim 1.

23. The panel unit of claim 22, wherein the panel unit is a flat panel display (FPD), a touchscreen panel (TSP) display, a flexible display, or a foldable display.

24. A method of preparing a nanostructure having a conductive region and a nonconductive region, the method comprising:
    forming a first nanowire layer comprising at least one first nanowire;
    preparing a conductive film including the first nanowire and a matrix by coating a matrix-forming material on the first nanowire layer; and
    etching one region of the conductive film by bringing an etching solution including at least one of alkali metal hypochlorite and alkali earth metal hypochlorite into contact with the one region under weak acidic conditions or under alkaline conditions to form at least one second nanowire, the at least one second nanowire being at least partially disconnected; and
    the conductive region and the nonconductive region not overlapping in a planar direction of the conductive film.

25. The method of claim 24, further comprising:
    forming a photoresist film on the conductive film before the etching of the one region, and
    bringing the etching solution into contact with the one region of the conductive film by using the photoresist film as an etching mask.

26. The method of claim 24, wherein the at least one of the alkali metal hypochlorite and alkali earth metal hypochlorite comprises sodium hypochlorite, potassium hypochlorite, lithium hypochlorite, magnesium hypochlorite, calcium hypochlorite or a mixture thereof.

27. The method of claim 24, wherein a pH of the weak acidic conditions is in a range of about 3 to about 6, and a pH of the alkaline conditions is about 10 or greater.

28. The method of claim 24, wherein the etching solution comprises at least one of a pH adjusting agent, a reaction retardant, an oxidant, and an etching agent.

29. The method of claim 28, wherein the oxidant comprises at least one of a peroxide, a persulfide, a peroxo compound, a metal oxide salt, an organic oxidant, and a gas oxidant.

30. The method of claim 28, wherein the etching agent comprises at least one of nitric acid, phosphoric acid, acetic acid, sodium nitrate ($NaNO_3$), and a halide.

31. The method of claim 24, wherein an amount of the at least one of the alkali metal hypochlorite and the alkali earth metal hypochlorite is in a range of about 1% to about 30% by weight in the etching solution.

32. The method of claim 24, wherein the etching solution is brought into contact with the one region of the conductive film for about 10 seconds to about 10 minutes.

33. The method of claim 24, wherein a conductive polymer film is formed on at least one portion of a surface of the first nanowire.

34. A nanostructure having at least one first nanowire and at least one second nanowire, the nanostructure comprising:
    a conductive region including the at least one first nanowire embedded in a matrix; and
    a non-conductive region including the at least one second nanowire embedded in the matrix, the at least one second nanowire being at least partially disconnected;
    the conductive region and the non-conductive region being on a base material; and
    the conductive region and the non-conductive region not overlapping in a planar direction of the base material.

35. The nanostructure of claim 34, wherein:
    the conductive region has a first pattern and the non-conductive region has a second pattern; and
    a visibility impairment between the first and second patterns is reduced based on the at least one second nanowire being at least partially disconnected.

36. The nanostructure of claim 34, wherein an average diameter of the at least one second nanowire is lower than an average diameter of the at least one first nanowire.

37. The nanostructure of claim 34, wherein a difference between an average diameter of the at least one second nanowire and the average diameter of the at least one first nanowire is less than about 5% or less than about 10%.

38. The nanostructure of claim 37, wherein an average diameter of the second nanowire is in a range of about 9.5 nm to about 95 nm, and an average length of the second nanowire is in a range of about 2.4 μm to about 80 μm.

39. The nanostructure of claim 38, wherein an average diameter of the first nanowire is in a range of about 10 nm to about 100 nm, and an average length of the first nanowire is in a range of about 3 μm to about 100 μm.

40. The nanostructure of claim 34, wherein a resistance of the at least one second nanowire is lower than a resistance of the at least one first nanowire.

41. The nanostructure of claim 34, wherein a difference between a resistance of the at least one second nanowire and the resistance of the at least one first nanowire is about $10^9$ Ω/cm or greater.

42. The nanostructure of claim 34, wherein a transmittance of the non-conductive region is greater than a transmittance of the conductive region, and a difference between the transmittance of the non-conductive region and the transmittance of the conductive region is about 0.1% or less.

* * * * *